United States Patent [19]

Konno et al.

[11] Patent Number: 5,537,566
[45] Date of Patent: Jul. 16, 1996

[54] APPARATUS AND METHOD FOR CONTROLLING BACKGROUND PROCESSING IN DISK ARRAY DEVICE

[75] Inventors: Shigeo Konno; Tatsuo Matoba, both of Kawasaki, Japan

[73] Assignee: Fujitsu Limited, Kawasaki, Japan

[21] Appl. No.: 988,215

[22] Filed: Dec. 9, 1992

[30] Foreign Application Priority Data

Dec. 17, 1991 [JP] Japan ................................ 3-333281
Dec. 17, 1991 [JP] Japan ................................ 3-333282

[51] Int. Cl.$^6$ .................................................. G06F 13/26
[52] U.S. Cl. ...................... 395/441; 395/478; 395/485; 395/490
[58] Field of Search .................. 364/200 MS File, 364/900 MS File; 395/400 MS, 425 MS

[56] References Cited

U.S. PATENT DOCUMENTS

| | | | |
|---|---|---|---|
| 4,092,732 | 5/1978 | Ouchi | 364/900 |
| 4,775,978 | 10/1988 | Hartness | 371/38 |
| 4,817,035 | 3/1989 | Timsit | 364/900 |
| 4,849,927 | 7/1989 | Vos | 364/200 |
| 5,124,987 | 6/1992 | Milligan et al. | 371/10.1 |
| 5,249,279 | 9/1993 | Schmenk et al. | 395/425 |
| 5,258,984 | 11/1993 | Menon et al. | 371/10.1 |
| 5,274,799 | 12/1993 | Brant et al. | 371/10.1 |
| 5,303,244 | 4/1994 | Watson | 395/400 |

FOREIGN PATENT DOCUMENTS

| | | |
|---|---|---|
| 0320107 | 2/1991 | European Pat. Off. |
| 0519670 | 12/1992 | European Pat. Off. |
| 0450801 | 2/1994 | European Pat. Off. |

OTHER PUBLICATIONS

Muntz, et al., "Performance Analysis of Disk Arrays Under Failure." Aug. 1990, pp. 162–173.
F. Bastani, et al., "Performance Analysis of Concurrent Maintenance Policies of Servers in a Distributed Environment," Nov., 1986, pp. 611–619.
International Publication No. WO 91/16711, published Oct. 31, 1991, Abstract.

Primary Examiner—Reba I. Elmore
Attorney, Agent, or Firm—Greer, Burns & Crain Ltd.

[57] ABSTRACT

An apparatus and method for controlling a background process in a disk array device including a disk array control unit which accesses the plurality of storage disk drives in parallel when a command for an access is issued from a host device and which executes a background process for the plurality of storage disk drives. The disk array control unit counts an amount of access, such as a data transfer amount to or from the host device, temporarily restrains an access requirement from the host device depending upon whether or not there is any background processing requirement when the data transfer amount reaches a predetermined transfer amount, and executes the background process. Access frequency of the host device may also be monitored as the amount of access. When one of working storage disk drives fails, data that was stored in the failed working storage disk drive is reconstructed from data stored in other working storage disk drives. The reconstruction is conducted during spare time during which there is no access from the host device. The data reconstruction amount may be changed in proportion to the amount of access until the spare time becomes available.

32 Claims, 22 Drawing Sheets

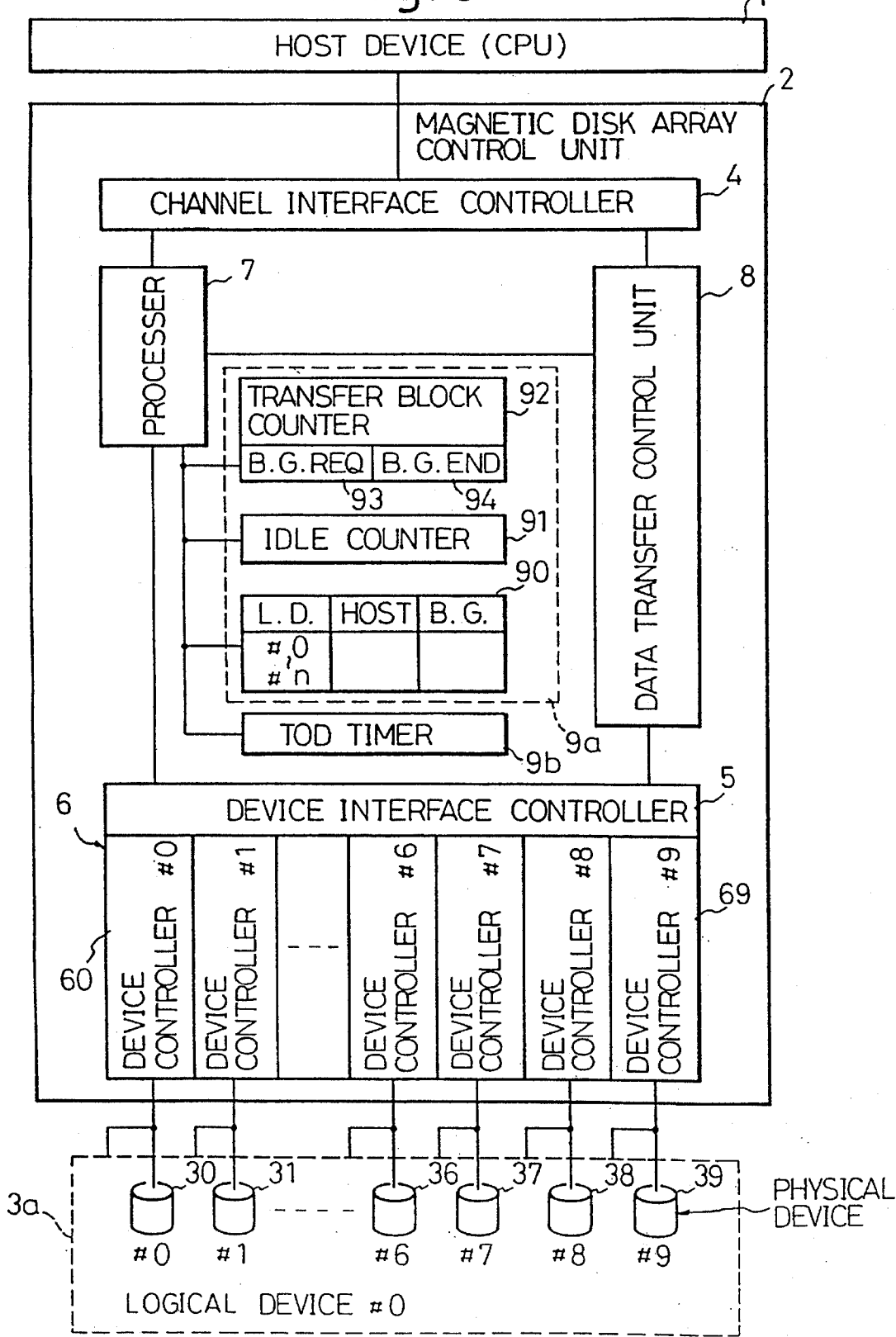

FROM Ⓑ IN FIG.14   FROM Ⓐ IN FIG.14

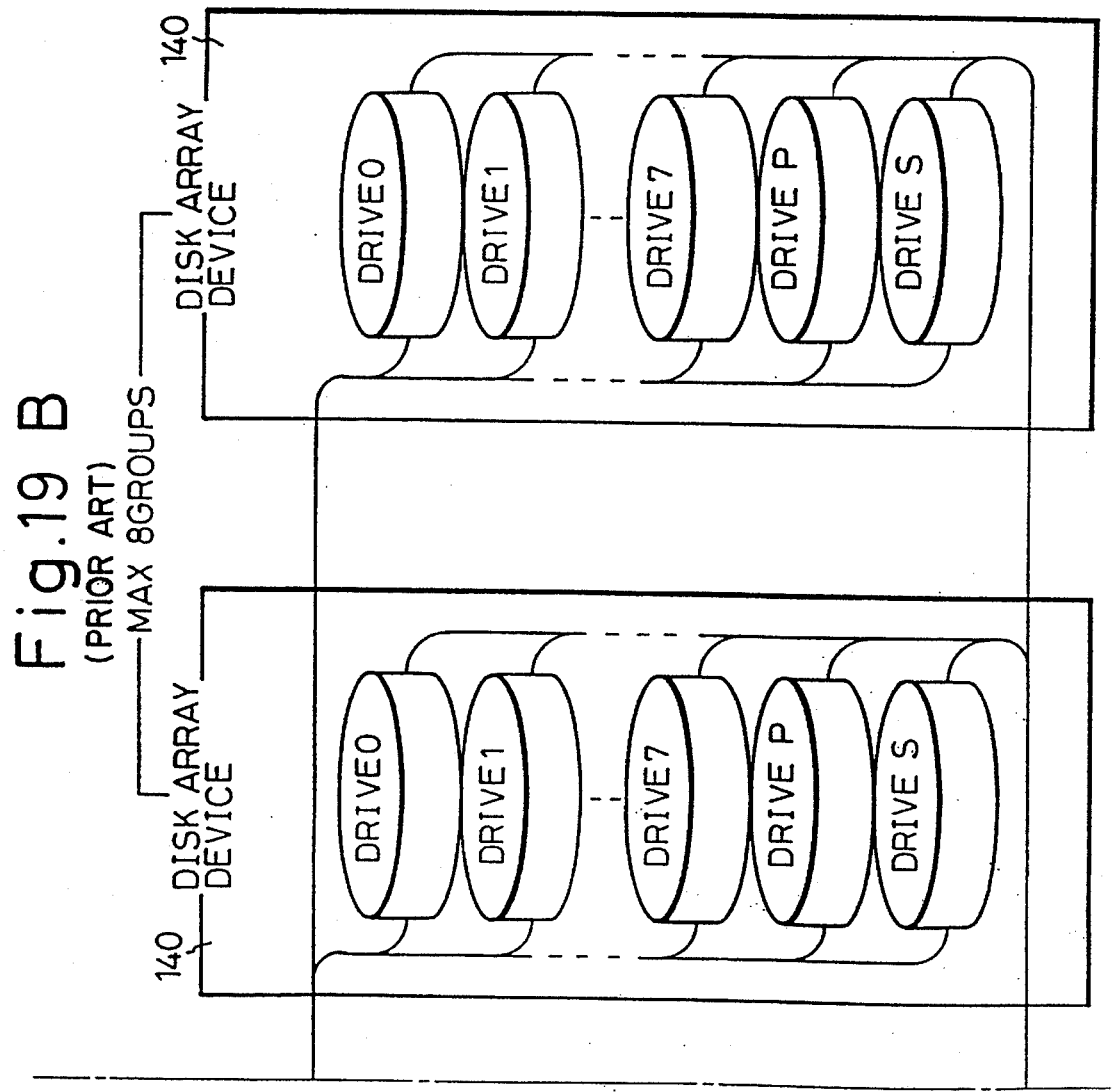

APPARATUS AND METHOD FOR CONTROLLING BACKGROUND PROCESSING IN DISK ARRAY DEVICE

BACKGROUND OF THE INVENTION

1. Field of the Invention

The present invention relates to an apparatus and method for controlling a background processing in at least one disk array device, the apparatus and method being adapted to execute a background process such as data reconstruction process while having as little influence as possible on a host device, e.g., a host computer.

More specifically, the present invention relates to an apparatus and method for controlling the data reconstruction process in the disk array device including a plurality of storage disk drives. The disk array device reconstructs data from another storage disk drive and stores the reconstructed data in a spare storage disk drive using a spare time of a host device in the event of a failure of a storage disk drive.

There is recently a tendency to demand, in a computer system, a transfer of large amounts of data such as image data at high speed, and therefore, an auxiliary storage device is also required to transfer large amounts of data at high speed to exchange data with a host device, when a command for an access is issued from the host device.

To meet this requirement an auxiliary storage device, e.g., magnetic disk array device, has been developed, which is mainly constituted from at least one logical device including a plurality of physical devices. The physical devices may be several units of disk drives, such a configuration enables plural bytes of data to be transferred in parallel between the host device and the logical device.

2. Description of the Related Art

In general, in a single unit of a magnetic disk drive, data transfer speed is limited by a rotation speed of a motor which rotates a magnetic disk being used as a recording medium. Accordingly, one way to attain high speed operation by increasing a data transfer speed, is to perform read/write operations in parallel by driving a plurality of disk drives, called a disk array device, simultaneously. In such a device, according to an access command from a host device, the spindle motors of the magnetic disk drives such as a disk array device connected in parallel with the host device are synchronously rotated, so that it becomes possible to perform a parallel transfer of data.

Further, in addition to the data transfer at high speed, fault tolerance of the whole system is also required for that disk array device so that sufficient reliability for the large amounts of data can be ensured without decreasing the data transfer speed.

To attain such a fault tolerant system, even though a failure, such as the inability to read data from one disk drive of a plurality of disk drives, has occurred, it is necessary for the disk array device to be constructed so that the data of the failed disk drive can be reconstructed immediately without stopping the whole system of the disk array device.

Some kinds of disk array device in practical use, in which the above-mentioned data transfer at high speed and the fault tolerance can be satisfied simultaneously, have begun to be announced by various computer manufacturers as the products of disk array device called RAID (Redundant Arrays of Inexpensive Disks) 1 to RAID 5.

Among these RAIDs 1–5, RAID 3, which is especially adequate for the case where large amounts of data have to be processed continuously at high speed, e.g., scientific calculations, will be described in more detail.

In the RAID 3, the disk array device typically includes a plurality of disk drives for data transfer (for example, eight (8) disk drives) and a disk drive for parity checking, all these disk drives operating in parallel simultaneously. In this case, some given parity data corresponding to the parallel data of the respective disk drives for data transfer are stored in advance in the disk drive for parity checking (parity disk drive). In such a construction, even though one disk drive of a plurality of disk drives fails so that the data cannot be read out, the data can be reconstructed by reading the parity data from the parity disk drive.

Further, in the RAID 3, a spare storage disk drive is also provided. When a disk drive fails all the data in the failed disk drive is automatically reconstructed and transferred into the spare storage disk drive. When such a data reconstruction process is completed, the spare storage disk drive can be utilized as a normal disk drive, in cooperation with the other disk drives for data transfer.

In this manner, a disk array device as represented by the RAID 3, which enables large amounts of data to be transferred at relatively high speed (for example, 36 MBytes/sec) and has substantially fault tolerant characteristics, can be prepared.

Namely, such a disk array device may conduct, when one of the disk drives fails, a background process. A background process is the data reconstruction process for constructing data in the failed disk drive from data stored in the remaining disk drives and for storing the reconstructed data in the spare storage disk drive. In this case, while the data reconstruction process is being executed, an access command sent from the host device cannot be executed. Accordingly, the question arises as to which should have higher priority, an access of the host device or execution of the background process.

To address this question, the typical apparatus for controlling the background process in the disk array device according to the prior art will be explained with reference to FIG. 1.

FIG. 1 is a block diagram showing such a controlling apparatus according to a typical prior art device.

As shown in FIG. 1, a disk array device is provided with a magnetic disk array control unit 2 connected to a host device (CPU) 1 such as a host computer, and a plurality of logical devices 3a to 3n connected in parallel with the magnetic disk array control unit 2.

Each of the logical devices 3a to 3n includes eight physical devices for data (magnetic disk drive) 30 to 37, one physical device for parity data (magnetic disk drive) 38, and one spare physical device (magnetic disk drive) 39.

Data is divided into eight sections, which are in turn stored on the magnetic disk drives for data 30 to 37. Parity data for the data is stored on the magnetic disk drive for parity data (also referred to as a parity disk drive) 38.

For instance, if it is assumed that 4096 bytes constitute one unit of data to be transferred, one eighth of that unit, namely 512 bytes (1 block), is stored on each of the magnetic disk drives for data 30 to 37, and the parity data for that unit of data is stored in the magnetic disk drive for parity data 38.

On the other hand, the magnetic disk array control unit 2 includes a channel interface controller 4 for controllably interfacing channels of the host device 1 with the unit 2, a device interface controller 5 for controllably interfacing the unit 2 with a device, e.g., device controllers 60 to 69 which are controlled by the device interface controller 5 and which control the magnetic disk drives 30 to 39, a data transfer control unit 8 for controllably transferring data between the channel interface controller 4 and the device interface controller 5, and a processor (main controller) 7 for controlling the controllers 4, 5 and 8.

In this disk array device, a read access from the host device 1 is sent through the channel interface controller 4 to the processor 7, which in turn instructs the read access to the device interface controller 5. The controller 5 causes the respective magnetic disk drives 30 to 38 to each carry out a seek operation by controlling the device controllers 60 to 68. Upon completion of the seek operation, the processor 7 activates the data transfer control unit 8 and the channel interface controller 4.

The data from the respective magnetic disk drives 30 to 38 are input in parallel to the device interface controller 5 through the device controllers 60 to 68. A parity check is performed with 8 bytes of data and 1 byte of parity data, and 8 bytes of checked data are transferred from the data transfer control unit 8 to the host device 1 through the channel interface controller 4.

On the other hand, a write access from the host device 1 is sent through the channel interface controller 4 to the processor 7, which in turn instructs the write access to the device interface controller 5. The controller 5 causes the respective magnetic disk drives 30 to 38 to carry out a seek operation by controlling the device controllers 60 to 68. Upon completion of the seek operation, the processor 7 activates the data transfer control unit 8 and the channel interface controller 4.

The data from the host device 1 is transferred by the data transfer control unit 8 to the device interface controller 5 through the channel interface controller 4. In the controller 5, 1 byte of parity data is generated for 8 bytes of data. Then, 8 bytes of data is written on the magnetic disk drives for data 30 to 37 for each byte by the device controllers 60 to 67, and 1 byte of parity data is written on the magnetic disk drive for parity data 38.

Incidentally, when abnormalities such as a reading error or another failure occur more than a specified number of times in one of the magnetic disk drives 30 to 38, this magnetic disk drive will no longer be used.

In that event, the data that was stored on the failed magnetic disk drive can be reconstructed from the data stored on the magnetic disk devices 30 to 38 excluding the failed disk drive, as shown in the lowest portion of FIG. 1. Accordingly, the device interface controller 5 reconstructs the data that was stored on the failed disk drive and reads the reconstructed data.

According to the above processing, a longer data reading time is required since it may take a relatively long time to reconstruct the data. Consequently, a read access time is likely to be lengthened. Further, the disk array devices is unlikely to find a storage disk drive on which data is to be written in a write operation. In view of this, a spare storage disk drive is provided (also referred to as a spare disk drive) 39 in which the data is written. The data that was stored in the failed disk drive is reconstructed from the data stored in other disk drives during spare time when no access is being made by the host device 1, and the reconstructed data is stored in the spare storage disk drive 39. Upon completion of reconstruction of the data in the failed disk drive, the spare disk drive 39 is used in place of the failed disk drive.

The background process including the data reconstruction process, a replacement process for replacing a failed part of the magnetic disk drive, and an initialization process for initializing recording media, i.e., magnetic disks, of the magnetic disk drive is executed making use of spare time of the disk array control unit spare time, a time for the control unit during which no data is being transferred to or from the host device, in consideration of the influence on the host device.

However, the following problems have existed in the prior art as described with reference to FIG. 1.

(1) If the disk array drive is connected to a super computer or the like in order to increase the processing capability of a host computer serving as a host device, a huge amount of data is transferred during one data transfer and an access frequency is high. Therefore, it is difficult to obtain the time for executing a background process since little spare time exists.

(2) Similarly, when the disk array device is shared by a plurality of host computers, the access frequency becomes higher and it becomes more difficult to obtain the spare time for executing the background process.

Furthermore, as described before, the above data reconstruction processing is carried out making use of spare time of the disk array device, and is accordingly required to be carried out by dividing the data into units of track or cylinders of each disk. Conventionally, an amount of data to be reconstructed (data reconstruction amount) during one reconstruction process is fixed (e.g. by a unit of one track) when the disk array device is powered on.

Thus, the following other problems have occurred in the prior art.

(3) In the case where a data reconstruction amount during one reconstruction process is set at a small value, it takes time to reconstruct the data completely. Difficulties arise if not much spare time is available due to the accesses made frequently by the host device 1. For instance, if the data restore amount is set at 1 block (512 bytes), it may take 30 minutes to reconstruct the data completely. In this case, since the data is restored during the data reading time, this results in a deterioration of reading performance.

(4) In the case where the data reconstruction amount during one reconstruction process is set at a large value, it takes time to reconstruct the data during such a process. This causes the host device to always wait for a long time to gain access, and therefore, the performance of the disk array device is also deteriorated.

SUMMARY OF THE INVENTION

In view of these problems, an object of the present invention is to provide an apparatus and method for controlling a background process in at least one disk array device. According to this aspect of the invention influence on the access of a host device is suppressed to a minimum level so as to ensure a time required for executing a background process.

A further object of the present invention is to provide an apparatus and method for executing a background process in a disk array device, which enable performance of both access by host device and background processing to be improved.

A still further object of the present invention is to provide an apparatus and method for controlling a background process in the disk array device, in which the time for executing a background process can be ensured, even when an amount of transferred data is remarkably increased and an access frequency from a host device become higher.

A still further object of the present invention is to provide an apparatus and method for controlling a background process in a disk array device, which can effectively execute a background process at least including a data reconstruction process.

A still further object of the present invention is to provide an apparatus and method for controlling a background process in a disk array device which enable a data reconstruction amount to be changed in proportion to an access frequency by a host device.

To attain the above objects, the apparatus for controlling a background process in disk array device according to the present invention comprises a disk array control unit which accesses a plurality of storage disk drives in parallel when a command for an access is issued from a host device. The device executes a background processing for the plurality of storage disk drives, that is not associated with the access from the host device, and monitors the present status of the access from the host device. The device also adjusts an operating ratio of said background processing to said access in proportion to the present status of the host access.

Preferably, in the apparatus according to the present invention, the disk array control unit counts a data transfer amount to or from said host device. The unit also restrains an access requirement from the host device temporarily depending upon whether or not there is any background processing requirement when the data transfer amount reaches a predetermined amount. Additionally, the disk array control unit executes the background processing.

Further, preferably, the disk array control unit includes a host controller for controllably interfacing the disk array control unit with the host device; guest controllers for controlling the storage disk drives in parallel; a data transfer controller for transferring data between the host controller and the guest controllers; and a main controller for controlling these controllers. Further, in this case, the main controller is monitors the access from the host device, to accept a background processing requirement from the said guest controller, to count a data transfer amount to or from the host device, to restrain an access requirement from the host device temporarily when the data transfer amount reaches a predetermined amount, and to permit the guest controllers to execute the accepted background process.

More concretely, the main controller includes an idle counter for counting the number of times when a processing program is executed and a transfer block counter for counting the data transfer amount to or from the host device. Further, the main controller accepts the background processing requirement when the content of the idle counter reaches a predetermined value, to restrain the access requirement from the host device temporarily when the data transfer amount reaches a predetermined amount, and to execute the accepted background process.

Alternatively, the disk array control unit counts an access frequency of the host device and restrains an access requirement from the host device temporarily depending upon whether or not there is any background processing requirement when the access frequency reaches a predetermined amount. The unit also executes the background process.

More concretely, the main controller includes an idle counter for counting the number of times when a processing program is executed and an access counter for counting the access frequency of the host device. Further, the main controller accepts the background processing requirement when the content of the idle counter reaches a predetermined value, to restrain the access requirement from the host device temporarily when the access frequency reaches a predetermined amount, and to execute the accepted background process.

In a preferred embodiment, the background process includes a data reconstruction process, a replacement process for replacing a failed part of the storage disk drives, and a medium initialization process.

Further, preferably, in the apparatus according to the present invention, the disk array control unit monitors an access frequency of the host device, and such a disk array control unit, when one of working storage disk drives fails. The unit then reconstructs data that was stored in the failed working storage disk drive from data stored in other working storage disk drives, making use of spare time during which there is no access from the host device, to store the reconstructed data in the spare storage disk drive, and to change a data reconstruction amount in proportion to the access frequency until spare time becomes available.

Further, preferably, the disk array control unit includes a host controller for controllably interfacing the disk array control unit with the host device; guest controllers for controlling the storage disk drives in parallel; a data transfer controller for transferring data between the host controller and the guest controller; and a main controller for controlling these controllers. Further, in this case, the main controller monitors an access frequency of the host device and designates to the guest controller a data reconstruction amount in proportion to the access frequency until the spare time becomes available. The guest controller carries out the data reconstruction process using the designated data reconstruction amount.

More concretely, the main controller includes an idle counter for counting the amount of time during which there is an absence of access of the host device. Further, the main controller discriminates the presence or absence of access requirements from the host device, to determine that the spare time available when a value of the idle counter exceeds a predetermined value, and to determine the access frequency based on a period which has elapsed until the value of the idle counter becomes in exceeds the predetermined value.

More concretely, the main controller is sets a data reconstruction amount to a small amount when a long period has elapsed before the value of the idle counter exceeds the predetermined value, while setting the data reconstruction amount to a large amount when a short period has elapsed before the value of the idle counter exceeds the predetermined value.

Furthermore, various methods for controlling a background process in a disk array device can be realized utilizing the same principles of the apparatus according to the present invention as described above.

BRIEF DESCRIPTION OF THE DRAWINGS

The above objects and features of the present invention will be more apparent from the following description of the preferred embodiments with reference to the accompanying drawings, wherein:

FIG. 3 is a block diagram of a first exemplary embodiment according to the present invention;

FIGS. 19(A) and 19(B) are block diagrams of a magnetic disk array control unit and the overall disk array devices.

DESCRIPTION OF THE PREFERRED EMBODIMENT

Figure 1:
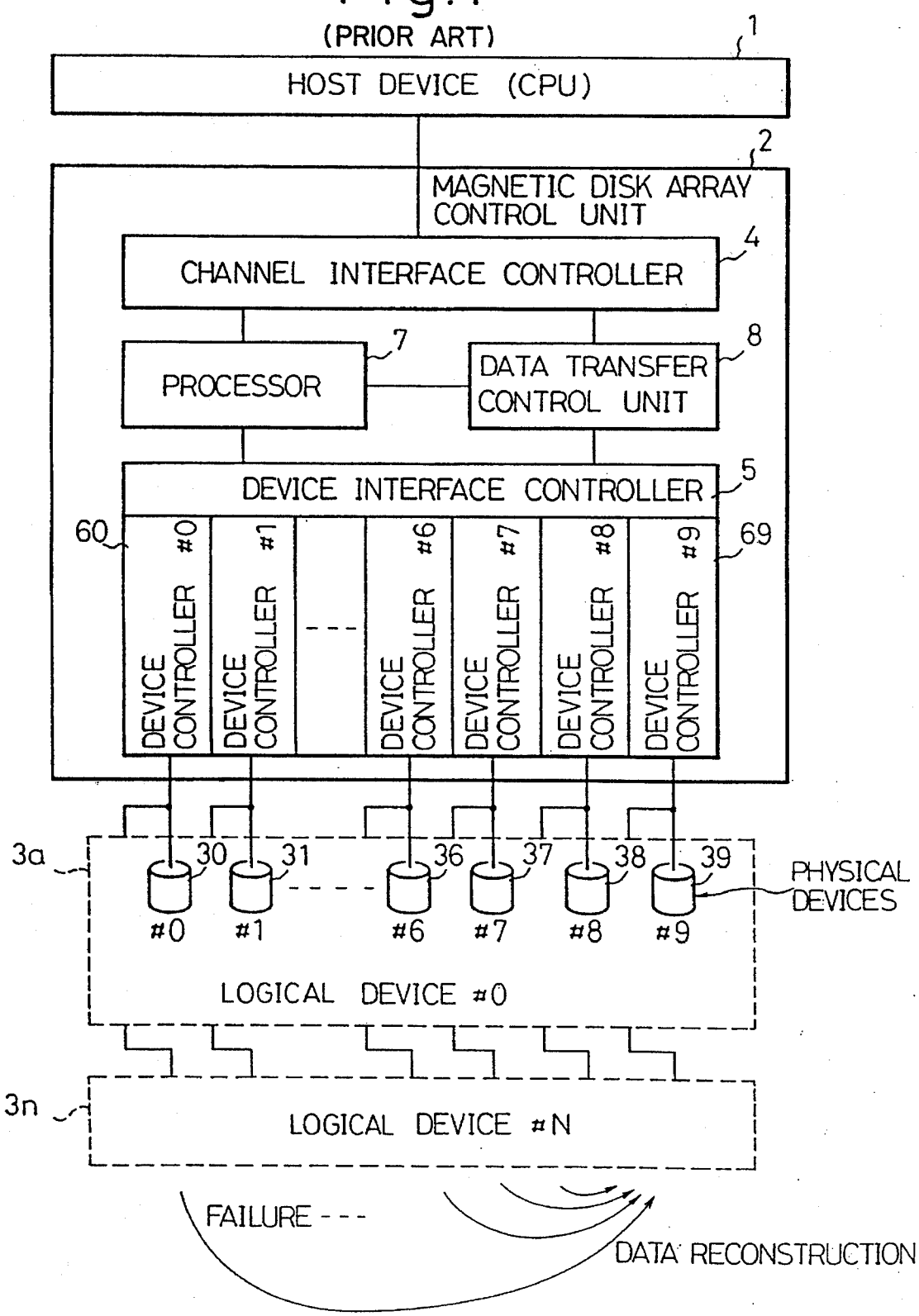
FIG. 1 is a block diagram showing an apparatus for controlling a background process according to a prior art.
Figure 2A:
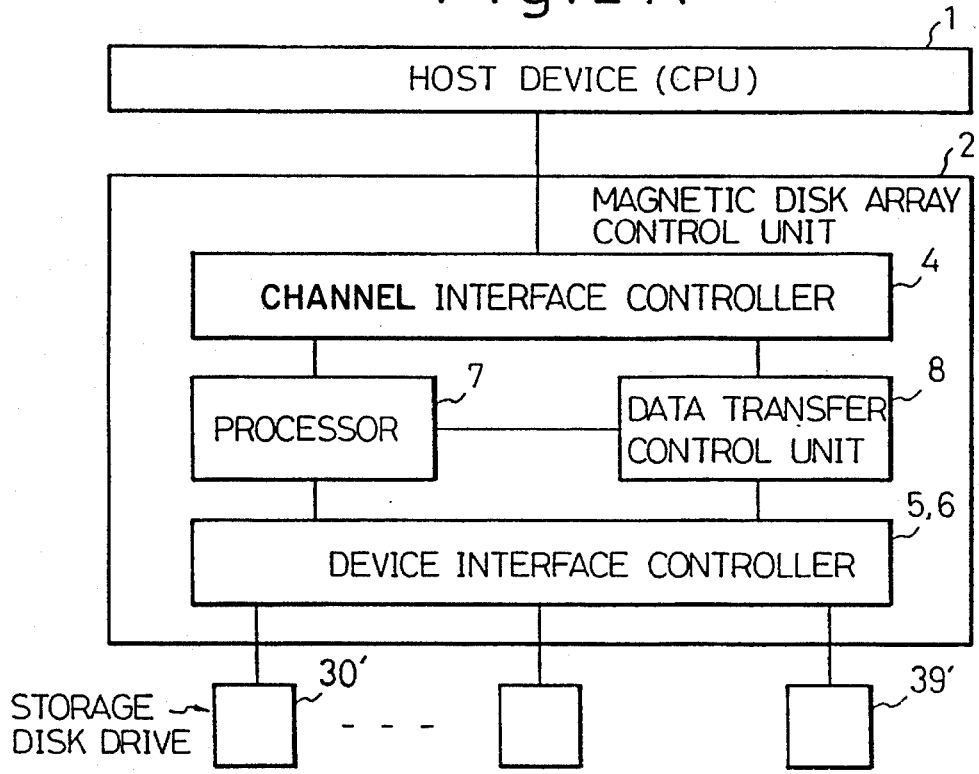
FIGS. 2(A) and 2(B) are a block diagram and a flowchart each showing an embodiment based on the first principle of the present invention, respectively.
Figure 2B:
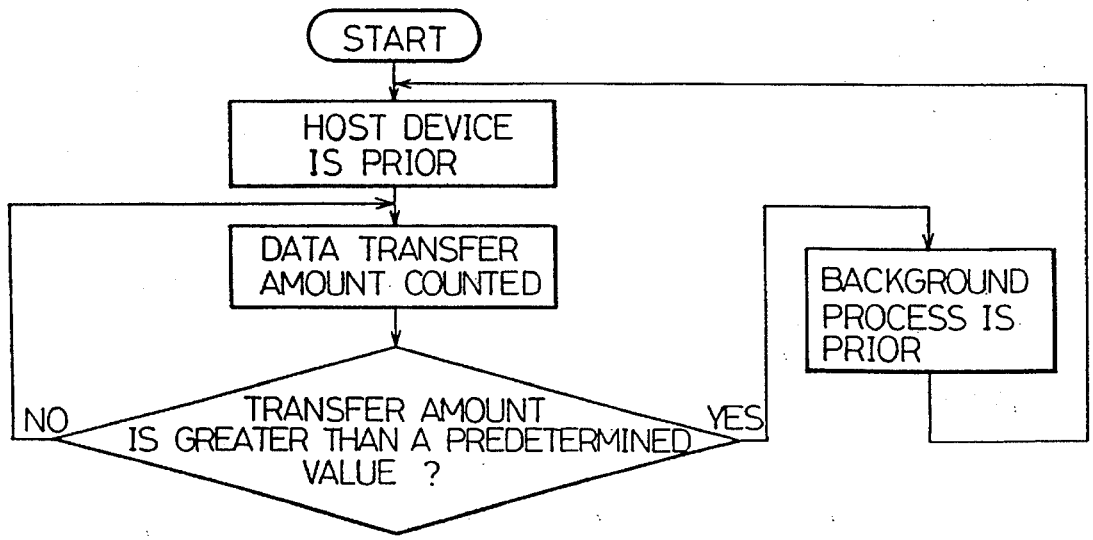

FIGS. 2(A) and 2(B) are a block diagram and a flowchart each showing an embodiment based on the first present invention, in which the same elements as in FIG. 1 are indicated with the same reference numerals.

FIGS. 2(A) and 2(B) are directed to a background process for a disk array device including a plurality of storage disk drives (physical devices 30 to 39 and a disk array control unit 2 which is connected in parallel with the plurality of storage disk drives 30 to 39. The control unit 2 access the plurality of storage disk drives 30 to 39 in parallel when an access is made by a host device 1. The disk array control unit 2 executes a background process for the plurality of storage disk drives 30 to 39, which is not associated with a data transfer with the host device 1, in response to a background process requirement. In this case the disk array control unit 2 counts a data transfer amount to or from the host device 1, restrains an access requirement from the host device 1 temporarily depending upon whether or not there is any background processing requirement when the data transfer amount reaches a predetermined amount, and executes the background process.

Further, the disk array control unit 2 increments an idle counter 91 (FIG. 8) upon each run of a processing program, accepts the background processing requirement when the content of the idle counter 91 reaches a predetermined value, restrains the access requirement from the host device 1 temporarily when the data transfer amount reaches the predetermined amount, and executes the accepted background process.

Further, the disk array control unit 2 executes the accepted background process upon determining that no access is being made by the host device 1.

Further, the disk array control unit 2 clears the data transfer amount upon completion of the background process.

Further, the array disk control unit 2 includes a channel interface controller 4 for control of interfacing the disk array control unit 2 with the host device 1. The unit 2 also includes guest controllers 5, 6 for controlling the storage disk drives 30 to 39 in parallel, a data transfer controller 8 for transferring data between the host controller 4 and the device interface/device controllers 5, 6, and a main controller 7 for controlling these controllers. In this case, the main controller 7 is adapted to monitor the access from the host device 1, to accept the background processing requirement from the device interface/device controllers 5, 6, to count the data transfer amount to or from the host device 1, to restrain the access requirement from the host device 1 temporarily when the data transfer amount reaches the predetermined amount, and to permit the device interface/device controllers 5, 6 to execute the accepted background process.

Further, the main controller 7 includes the idle counter 91 for counting the number of times when a processing program is executed and a transfer counter 92 for counting the data transfer amount to or from the host device 1. The main controller accepts the background processing requirement when the content of the idle counter 91 reaches a predetermined value, restrains the access requirement from the host device 1 temporarily when the data transfer amount reaches a predetermined amount, and executes the accepted background process.

Further, the main controller 7 executes the accepted background processing upon determining that no access is being made by the host device 1.

Further, the storage disk drives 30 to 39 include a plurality of working storage disk drives 30 to 38 and a spare storage disk drive 39. In this case, the background process is a data reconstruction process which is executed, when one of the working storage disk devices 30 to 38 fails, for reconstructing data stored in the failed storage disk drive from data stored in other working storage disk drives and writing the reconstructed data in the spare storage disk drive 39.

Further, the background process is a replacement process for replacing a failed part of the storage disk drives 30 to 39.

Further, the background process is a medium initialization process for the storage disk drives 30 to 39.

FIGS. 2(A) and 2(B) pertain to transfer of priority to execution of a background process and to suppression of the influence on the access by the host device 1 to a minimum level when the accumulated data transfer amount to or from the host device 1 reaches a specified mount since the data transfer amount to or from the host device 1 is in proportion to an occupying time of the host device 1 and the host device 1 is assumed to have had sufficient access at this time. Thus, the disk array control unit 2 counts the data transfer amount to or from the host device 1, restrains the access requirement from the host device 1 temporarily if there is a background processing requirement when the data transfer amount reaches the predetermined amount, and executes the background process.

A process for monitoring an access frequency of the host device 1 may be considered for this purpose. However, the occupation time cannot be determined from the access frequency because there is a difference in the data transfer amount per access. Accordingly, the data transfer amount is monitored.

Further, the disk array control unit 2 increments the content of the idle counter 91 upon each run of the processing program, accepts the background processing requirement when the content of the idle counter reaches the predetermined value, restrains the access requirement from the host device 1 temporarily when the data transfer amount reaches the predetermined amount, and executes the accepted background process. Thus, the background processing is accepted at every predetermined number of runs of the processing program, and priority is given to the background process depending upon the data transfer amount while prioritizing the access of the host device 1.

Further, the disk array control unit 2 executes the accepted background process upon determining that no access is being made by the host device 1. Thus, the background process can be executed in spare time of the host device 1 in a conventional way while giving priority to the background process depending upon the data transfer amount.

Further, the array disk control unit 2 clears the data transfer amount upon completion of the background process, making it possible to monitor a new data transfer amount.

Further, the array disk control unit 2 includes a channel interface controller 4 for control of interfacing the array disk control unit 2 with the host device 1, device interface/device controllers 5, 6 for controlling the storage disk drives 30 to 39 in parallel, a data transfer controller 8 for transferring data between the host controller 4 and the device outerface/device controllers 5, 6, and a main controller 7 for controlling these controllers, the main controller 7 being adapted to monitor access by the host device 1, accept the background processing requirement from the device interface/device controllers 5, 6, count the data transfer amount to or from the host device 1, restrain the access requirement from the host device 1 temporarily when the data transfer amount reaches the predetermined amount, and permit the device interface/device controllers 5, 6 to execute the accepted background process. Accordingly, it can be easily discriminated whether the access by the host device 1 or the background process are executable. In addition, the main controller 7 can execute other processes while executing the background process.

When the background process is a data reconstruction process, the data reconstruction process, which requires a long time, can be executed while restraining the access of the host device temporarily. Thus, a disk array operation is recovered in a short time, enabling high speed access.

Further, when the background process is a replacement process for a failed part, the replacement process that is required to be executed in a short time can be executed while restraining the access of the host device temporarily. Thus, the disk array operation is recovered in a short time, enabling high speed access.

Further, when the background processing is a medium initialization process, a debugging process or the like can be easily executed while operating the system (disk array device).

Figure 4:
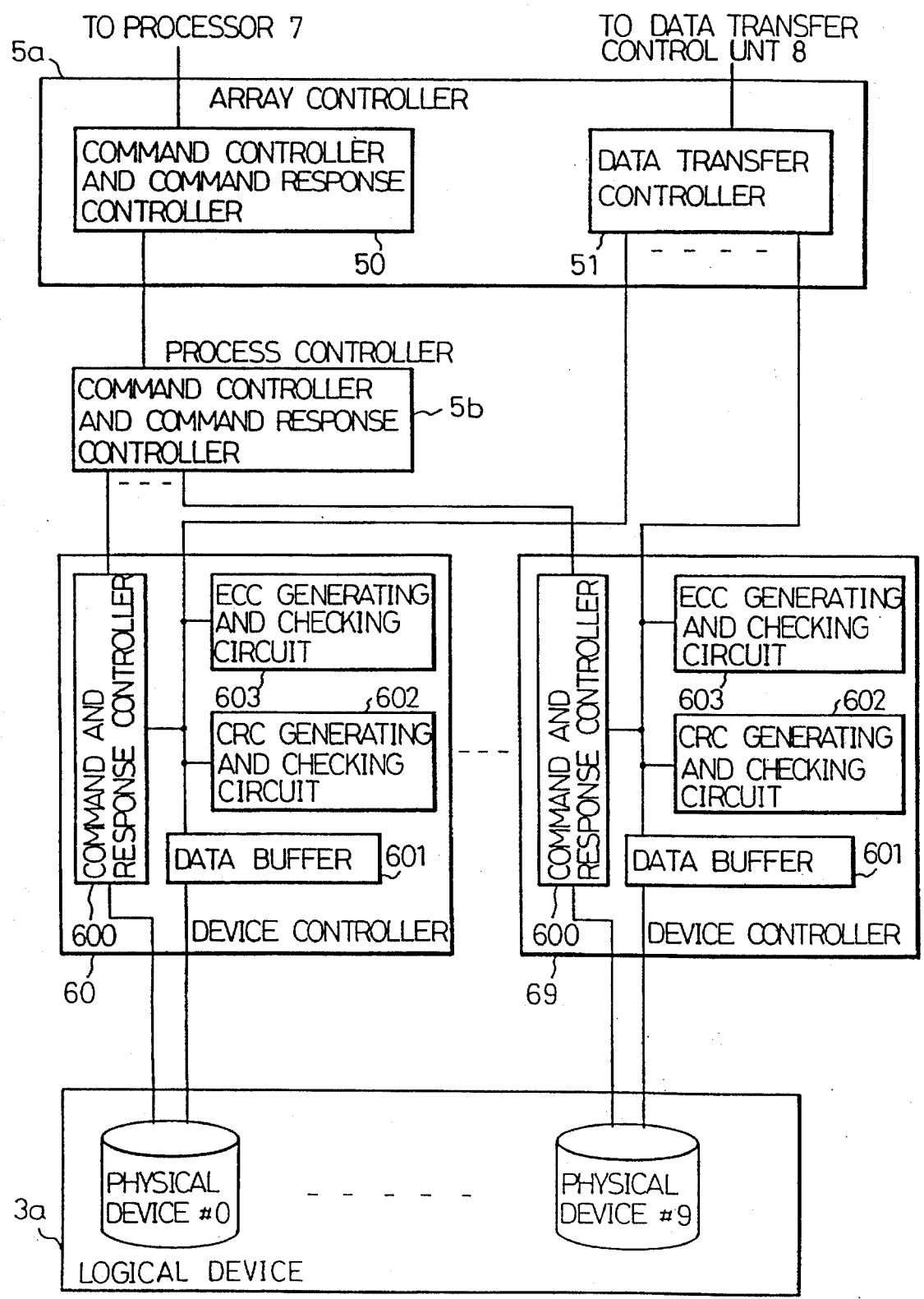
FIG. 4 is a block diagram showing a guest interface controller of FIG. 3 in more detail.

FIG. 3 is a block diagram of a first exemplary embodiment of the present invention, and FIG. 4 is a block diagram showing a interface control unit of FIG. 3 in more detail. FIGS. 3 and 4 show an array type magnetic disk system.

In FIG. 3, a magnetic disk array control unit 2 is provided with a control storage (memory) 9a and a TOD timer 9b serving as a clock in addition to a channel interface controller 4, a device interface controller 5, device controllers 60 to 69, and a processor 7.

In addition to a program area for storing a program, the control storage 9a includes a device information table 90 for storing a host flag indicative of execution of a host processing and a B.G. flag indicative of execution of a background process, an idle counter 91 for counting an idle time, a transfer block counter (also referred to as a transfer counter) 92 for counting the number of blocks of data to be transferred to and from the host device 1, a B.G. REQ flag 93 indicative of whether or not there is a background process required by the device interface controller 5, and a B.G. END flag 94 indicating that completion of the background process has been informed by the device interface controller 5.

In the illustrated first embodiment, a logic device 3a including magnetic disk drives 30 to 39 is connected to the device controllers 60 to 69. However, a plurality of logic devices are in fact connected to the device controller 60 to 69 as in an example shown FIG. 1.

The device interface/device device interface controller 5 includes, as shown in FIG. 4, an array controller 5a and a process controller 5b for controlling the respective device controllers 60 to 69, for determining states of the controllers 60 to 69 by receiving responses, and for giving a response.

The array controller 5a includes a command controlling and responding unit 50 for controlling a data transfer controller 51 and the process controller 5b upon receipt of a command from the processor 7, and for responding to the processor 7. Further, the array controller 5a includes and the data transfer controller 51 for adding parity data to the data transferred from the host device 1, distributing the data with the added parity data to the respective device controllers 60 to 69, conducting parity checks for the data from the device controllers 60 to 69 using the parity data thereof, transferring the checked data to the host device 1, and reconstructing the data upon receipt of an instruction requesting reconstruction of the data.

Each of the device controllers 60 to 69 includes a command and response controller 600 for controlling the magnetic disk drives 30 to 39 according to a command from the processing controller 5b and for giving a response to the process controller 5b, a data buffer 601 for storing data to and from the magnetic disk devices 30 to 39, a CRC generating and checking circuit 602 for generating CRC data for each block (512 bytes) of data to be written (write data) and for checking the CRC data for each block of data to be read (read data), and an ECC generating and checking circuit 603 for generating an ECC (error correcting code) for each block of write data (including the CRC data) and for checking the ECC for each block of read data (including the CRC data).

Figure 5:
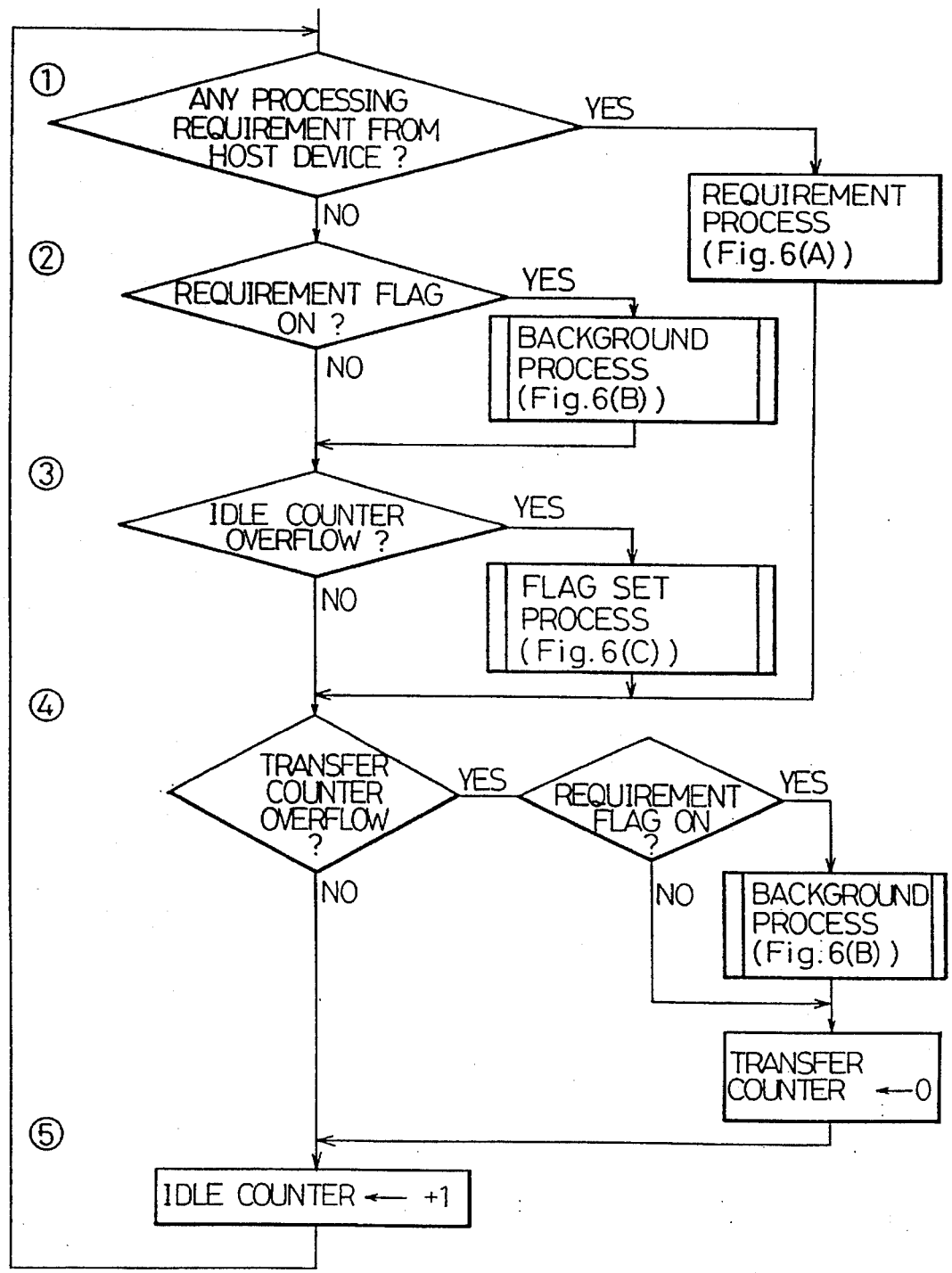
FIG. 5 is a flowchart for explaining a processing of a first embodiment according to the present invention.
Figure 6:
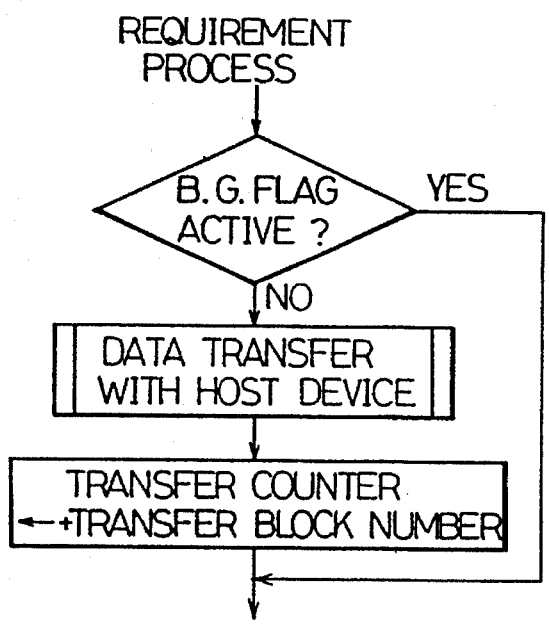
FIGS. 6(A), 6(B) and 6(C) are flowcharts showing a requirement process, a background process and a flag setting process of FIG. 5, respectively.
Figure 6:
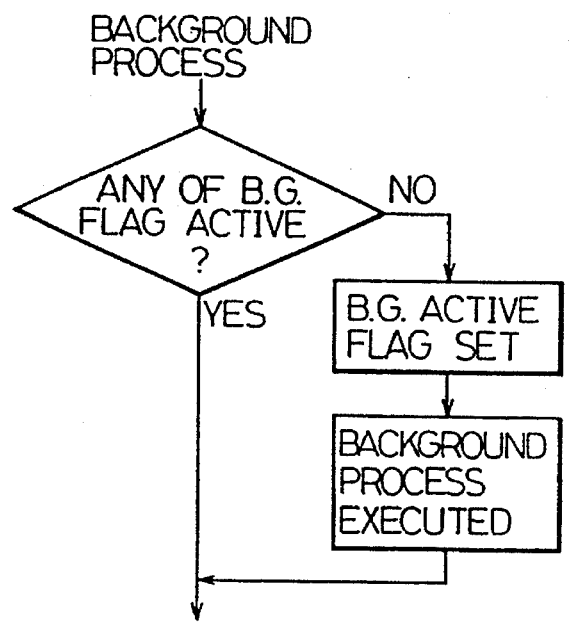
Figure 6:
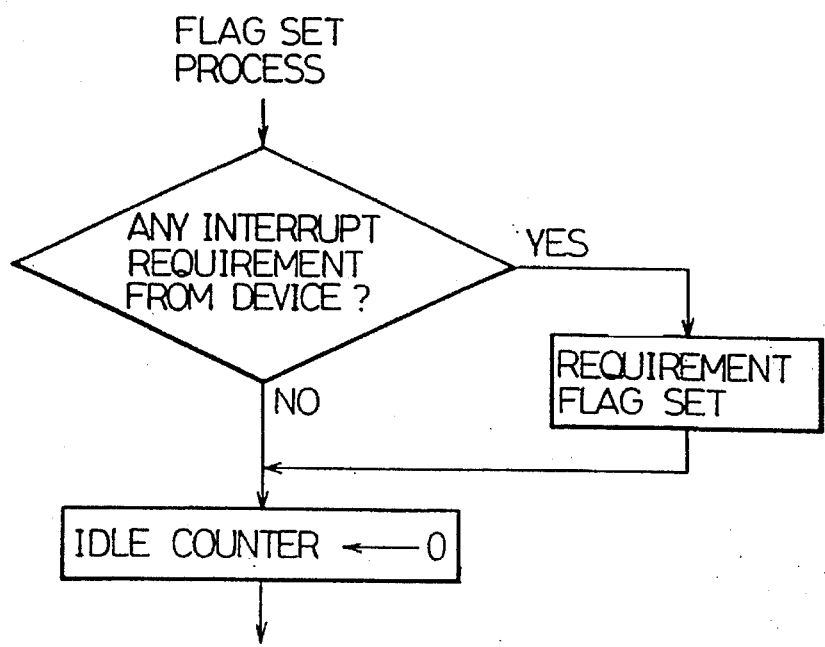
Figure 7:
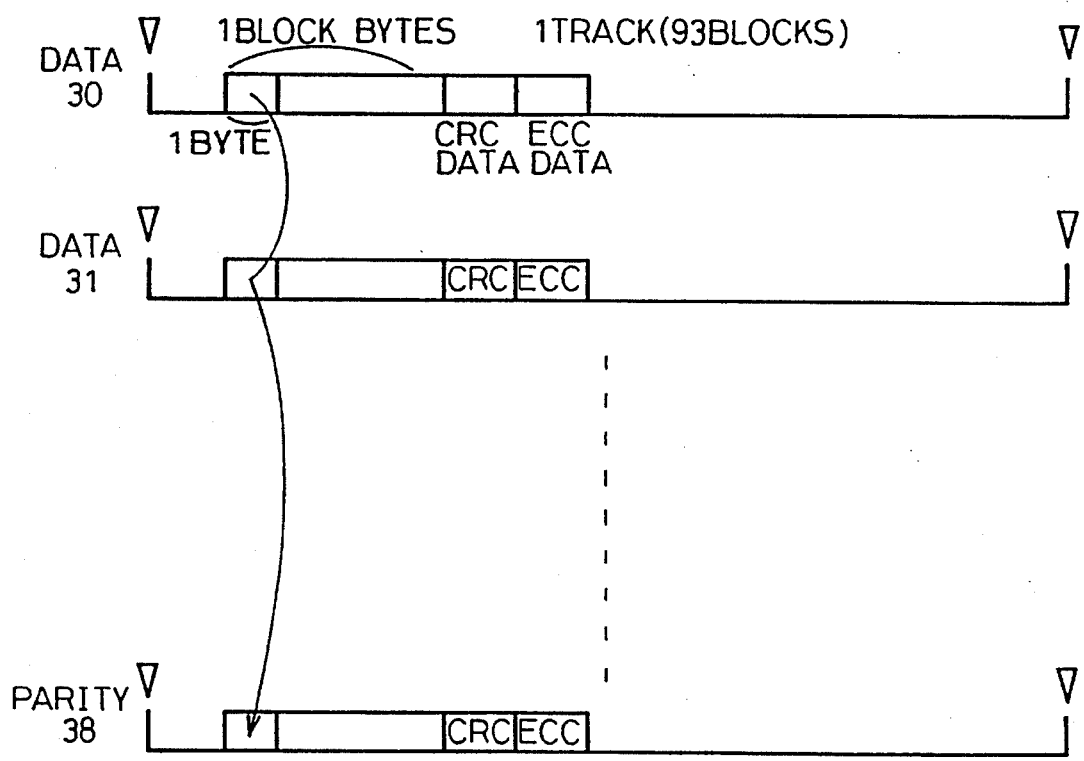
FIGS. 7(A) and 7(B) are time charts for explaining an operation of a first embodiment according to the present invention.
Figure 7:
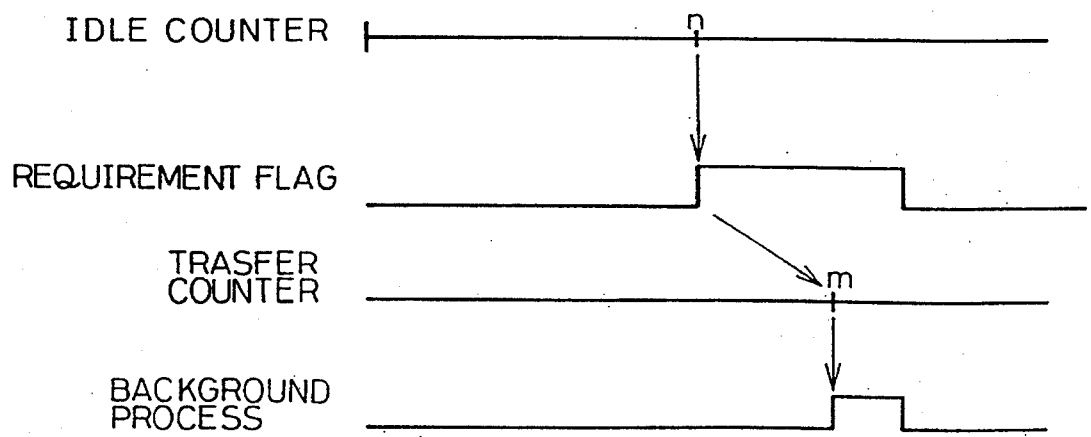

FIGS. 5, 6(A), 6(B) and 6(C) are flowcharts (No. 1), (No. 2) showing a process of a first embodiment of the present invention, and FIGS. 7(A) and 7(B) are time charts showing an operation of the first embodiment.

First of all, a normal access operation of the host device 1 will be described.

For example, at the time of a read access by the host device 1, the processor 7 sends a read command to the command and response controller 50 of the array controller 5a of the guest device interface controller 5, and instructs the process controller 5b to cause the respective magnetic disk drives 30 to 38 to carry out a seek operation to read cylinder positions by controlling the device controllers 60 to 69. Upon completion of the seek operation, the end of the seek operation is informed to the processor 7, and thereby the processor 7 begins a transfer control.

The processor 7 activates the data transfer control unit 8 and the channel interface controller 4. Further, the command and response controller 50 activates the data transfer controller 51. Thereafter, the desired blocks of data stored on the magnetic disk drives 30 to 38 are read through the device controllers 60 to 68; the parity check is applied to the read data; and the data from the eight magnetic disk drives are reconstituted to be transferred to the host device 1 through the data transfer control unit 8 and the channel interface controller 4.

If, for example, one transfer unit (transfer block) of data is 4096 bytes, the one transfer unit is divided into eight blocks (512 bytes per one block) which are stored in the magnetic disk drives for data 30 to 37. One track is constituted by 93 blocks.

One bit of parity data is generated each for 8 bits of data at the same bit position for 512 bytes data stored in each of the eight magnetic disk drives for data 30 to 37. Accordingly, for 4096 bytes of data, 512 bytes of parity data are stored in one block of the magnetic disk drive for parity data 38.

On the other hand, in the device controllers 60 to 68 for the magnetic disk drives 30 to 38, the CRC data is added to each block (512 bytes) of data, and the ECC is added to one block of data (including the CRC data). When the data is read, the CRC generating and checking circuit 602 checks the CRC data for each block of data, and the ECC generating and checking circuit 603 checks the ECC for each block of data (including the CRC data).

As described above, in the magnetic disk drives 30 to 38, a CRC check and an ECC check are applied to each block of data, and in the data transfer controller 51, the parity check is applied to the data from the magnetic disk drives 30 to 37 using the parity data from the magnetic disk drive 38.

Next, a process of the will be described embodiment next with reference to FIGS. 5, 6(A), 6(B) and 6(C).

(1) The processor 7 discriminates whether or not any access requirement (command) is made by the host device 1 through the channel interface controller 4. If so, the processor 7 executes a requirement processing routine shown in FIG. 6(A) and proceeds to Step (4).

In the requirement processing routine in FIG. 6(A), the processor 7 checks the B.G. flag column in the device information table 90. If any of the devices (disk drives) is executing a background process, the processor 7 informs the host device 1 that the device is busy and exits this routine. On the contrary, if none of the devices is executing a background process, the processor 7 conducts the data transfer with the host device upon receipt of a command requiring a data transfer such as read and write commands, increments the content of the transfer counter 92 by one (one transfer block=4096 bytes), and exits this routine.

It will be appreciated that the content of the transfer counter 92 is not incremented in a transfer command to read the data stored in the magnetic disk array control unit 2 since the logical device is not used.

(2) On the other hand, if there is no access requirement from the host device 1, the processor 7 discriminates the receipt of the background requirement by checking the B.G. REQ flag 93. If the background requirement has been received, the processor 7 executes the background process shown in FIG. 6(B) and proceeds to Step (3).

In a background processing routine shown in FIG. 6(B), the processor 7 checks the B.G. flag column in the device information table 90. If any of the devices is executing a background process, the processor 7 exits this routine immediately. If none of the devices is executing a background process, the processor 7 sets a flag for those devices in the B.G. flag column of the device information table 90, and executes the background process.

If the background process is, for example, a data reconstruction process, the processor 7 brings the channel interface controller 4 to the CU BUSY state and informs the host device 1 that the device is busy upon receipt of an access request from the host device 1. The processor 7 further instructs the device interface controller 5 to execute one data reconstruction process, disconnects the guest interface controller 5 therefrom, and proceeds to Step (3).

The thus disconnected device interface controller 5, as described above, reconstructs the data that was stored on the failed magnetic disk drive from the data stored in the magnetic disk drives 30 to 38 excluding the failed one, and stores the reconstructed data on the spare magnetic disk drive 39. The controller 5 reconstructs only a designated amount of data (by the track or by the cylinder) and, upon completion of one data reconstruction process, informs the processor 7 of completion of the interrupt routine.

(3) The processor 7 discriminates whether or not the idle counter 91 has overflowed (whether the content of the idle counter 91 is equal to or greater than a predetermined value n) if receiving no background requirement in Step (2) or after instructing execution of one data reconstruction process to the device interface controller 5. If the idle counter has overflowed, the processor 7 executes a flag set processing routine shown in FIG. 6(C) and proceeds to Step (4).

In the flag set processing routine shown in FIG. 6(C), the processor 7 scans the device controllers 60 to 69 through the device interface controller 5 so as to check whether or not there is a background processing requirement from the logical devices. If there is any, the processor 7 sets a flag in the B.G. REQ flag 93, resets the idle counter 91 because it has received the requirement, and exits this routine. The processor 7 resets the idle counter 91 even if there is no such requirement, and exits this routine.

(4) Subsequently, in Step (3), the processor 7 checks whether or not the transfer counter 92 has overflowed (whether the content of the counter 92 is equal to or greater than a specified amount, e.g., several tens of thousands of cylinders) if the idle counter 91 has not overflowed, after the flag set processing routine is executed, or after the requirement processing routine is executed in Step (1). If the counter 92 has overflowed, the processor 7 gives priority to the background process upon the determination that the host device 1 has had sufficient access, and checks whether or not the flag is set in the B.G. REQ flag 93.

If the requirement flag is set, the processor 7 executes the background processing routine shown in FIG. 6(B), and resets the transfer counter 92. If the requirement flag is not set, the processor 7 resets the counter 92. Then, the processor 7 proceeds to Step (5).

(5) The processor 7 increments the content of the idle counter 91 by "1" because the processing program has made one run, and returns to Step (1).

Informed of completion of one background processing from the device interface controller 5, the processor 7 resets active flags of the B.G. flags for corresponding devices in the device information table 90; resets the flag of the B.G. REQ flag 93; sets the flag of the B.G. END flag 94; and brings the channel interface controller 4 out of the CU BUSY state, thereby enabling the access from the host device 1.

This is described with reference to FIG. 7(B). Upon one run of the processing program, the processor 7 increments the content of the idle counter 91, and gives priority to the access of the host device 1 without accepting the background processing requirement from the device interface controller 5 until the idle counter 91 overflows.

When the idle counter 91 overflows, the processor 7 accepts the background processing requirement from the device interface controller 5, thereby setting the requirement flag.

This requirement is executed in Step (2) when it is determined that no access is being made by the host device 1, and accordingly spare time is available. However, this requirement is not executed as long as the access by the host device 1 continues.

In view of this, the amount of data transferred to or from the host device is counted with the use of the transfer counter 92. When this counter 92 overflows, it is determined that the host device 1 has had access for a substantial amount of time and a time for the background process could not be obtained. Thereupon, the background process is prioritized over the access by the host device and is executed while informing the host device 1 that the guest devices are busy upon receipt of an access request from the host device 1.

Upon completion of the background process, the transfer counter 92 is cleared and the priority if given to the host device 1 again.

The reason the transfer counter 92 is not cleared in Step (2) is that the background process is executed because the spare time is available in the host device 1. Priority is still given to the host device 1 over the background process, but the background processing is executed because there is no access being made by the host device 1.

More specifically, in this case, it is necessary to make the background process hold the right to change the order of priority based on the data transfer amount.

In this way, the host device 1 is normally prioritized, and the order of priority is changed when the data transfer amount to or from the host device reaches a predetermined amount, so as to prioritize the background process over the host device 1. In this way, the background process is executed while suppressing the influence on the access of the host device to a minimum level.

This prevents occurrence of a situation where the background processing cannot be executed, when a huge amount of data is being transferred to or from the host device 1, and contributes to suppressing the influence on the access of the host device 1 to the minimum level.

In addition to the foregoing first embodiment the invention can be modified in the following manner.

(1) Although the invention is described with respect to a disk array drive provided with magnetic disk drives in the foregoing embodiment, the invention is applicable to a disk array device provided with optical disk drives or like disk drives having mechanical operation.

(2) One run of the processing program is counted as an idle number in the foregoing embodiment. However, it may be appropriate to count the number of the absence of accesses from the host device as an idle number.

(3) Having described the invention with respect to data restoration process in the foregoing embodiment, the background process may be a replacement process for replacing a failed part of a storage disk drive, or may be a medium initialization process for the storage disk device.

(4) Although there is provided one spare disk drive in the foregoing embodiment, two or more spare disk drive may be provided.

As described above, a first embodiment demonstrates the following effects.

(1) A disk array control unit 2 monitors a data transfer amount to or from a host device 1. The background process is prioritized over the access by the host device 1 when the data transfer amount reaches a predetermined amount. Accordingly, the background process can be executed while suppressing the influence on the access of the host device to a minimum level even if a huge amount of data is to be transferred to or from the host device 1 or a high access frequency state is to be continued.

(2) Since the data transfer amount is monitored, priority will be given to the background process according to an occupying time of the host device 1. Even if there is a difference in the data transfer amount per access of the host device 1, the priority is given to the background processing accurately according the occupying time. Therefore, a background process can be executed without reducing the performance of an entire system.

Figure 8:
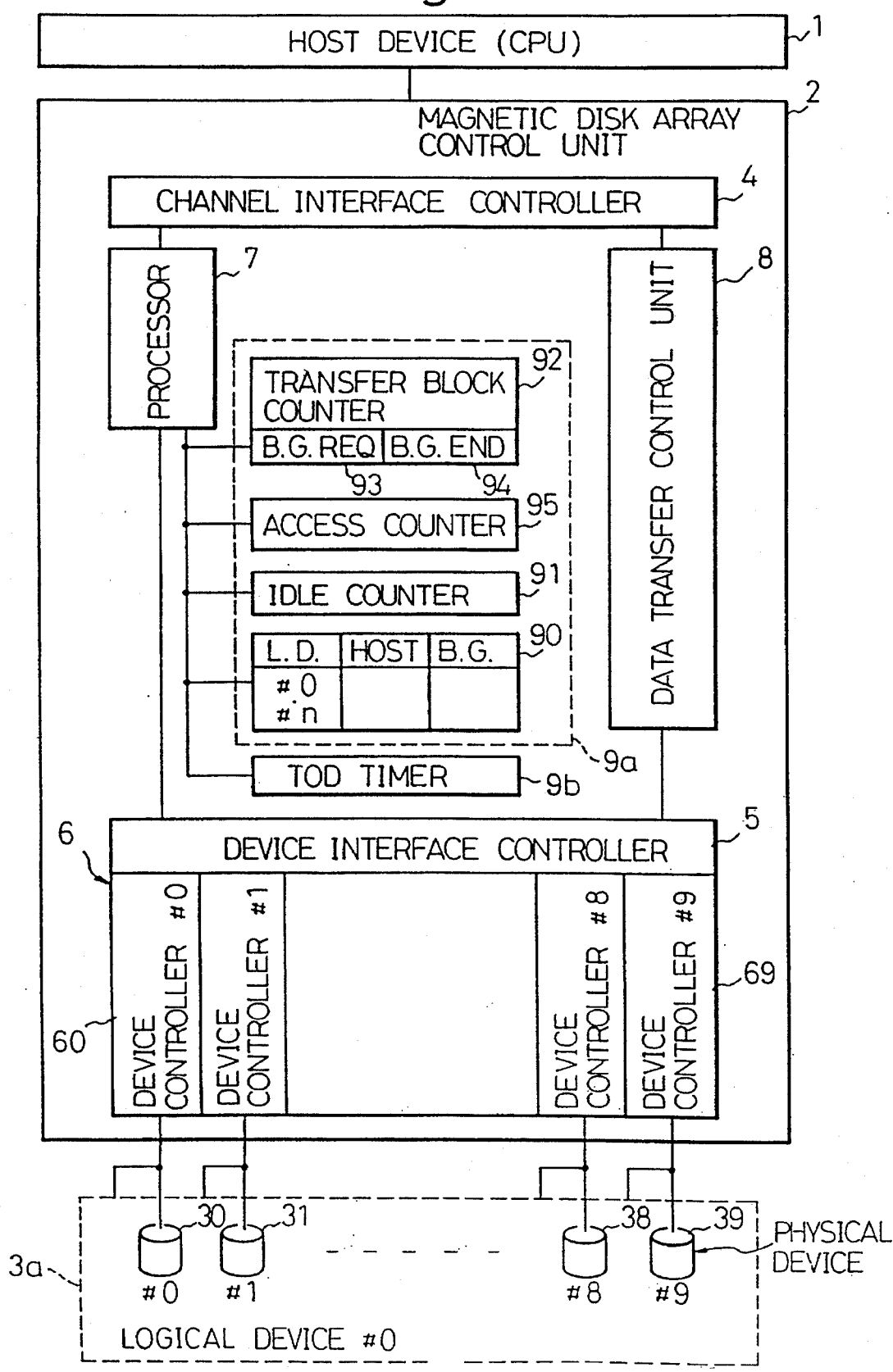
FIG. 8 is a block diagram showing a modification of a first embodiment of FIG. 3.

Further, FIG. 8 is a block diagram showing a modification of a first embodiment of FIG. 3. FIG. 8 also shows an array type magnetic disk system. In FIG. 8, a magnetic disk array control unit 2 is provided with a control storage (memory) 9a and a TOD timer 9b serving as a clock in addition to a channel interface controller 4, a device interface controller 5, device controllers 60 to 69, and a processor 7, similar to FIG. 3.

As shown in FIG. 8, the whole construction of FIG. 8 is substantially the same as that of FIG. 3. However, the construction of the modification as in FIG. 8 is different from that of a first embodiment as in FIG. 3, in that the former further includes an access counter 95 for counting an access frequency of a host device 1, in the control storage 9a.

More specifically, in addition to a program area for storing a program, the control storage 9a includes a device information table 90 for storing a host flag indicative of execution of a host process and a B.G. flag indicative of execution of a background process, an idle counter 91 for counting an idle number, a transfer block counter 92 for counting the number of blocks of data to be transferred to and from the host device 1. The above-mentioned access counter 95 is also included as well as, a B.G. REQ flag 93 indicative of whether or not there is a background process required by the device interface controller 5, and a B.G. END flag 94 indicating that completion of the background process is informed from the device interface controller 5.

Here, a more concrete explanation related to the access counter 95 will be given.

In FIG. 8, the disk array control unit 2 counts a data transfer amount to and from the host device 1 using transfer block counter 92, restrains the access requirement from the host device 1 temporarily when the data transfer amount reaches a predetermined amount, and permits the device interface/device controllers 5, 6 to execute the background process. Alternatively, the disk array control unit 2 counts an access frequency of the host device 1 by means of access counter 95, restrains the access requirement from the host device temporarily when the access frequency reaches the predetermined amount, and permits the device interface/device controllers 5, 6 to execute the background process.

Further, in FIG. 8, a processor (main controller) 7 accepts a background processing requirement when the content of the idle counter 91 reaches a predetermined value, and restrains the access requirement from the host device 1 temporarily, when the data transfer reaches a predetermined amount or when the access frequency reaches a predetermined amount, and then executes the accepted background process.

In this case, the access frequency of the host device 1 indicates the time per se occupied by the disk array control unit 2 connected to host device 1. Since the access counter 95 can detect the busy state of the access from the host device 1 by indicating that the access frequency of the host device 1 reaches the predetermined value, the influence on the access of the host device 1 due to the background process can be suppressed to a minimum level, even more firmly than the first embodiment as shown in FIG. 3.

Figure 9:
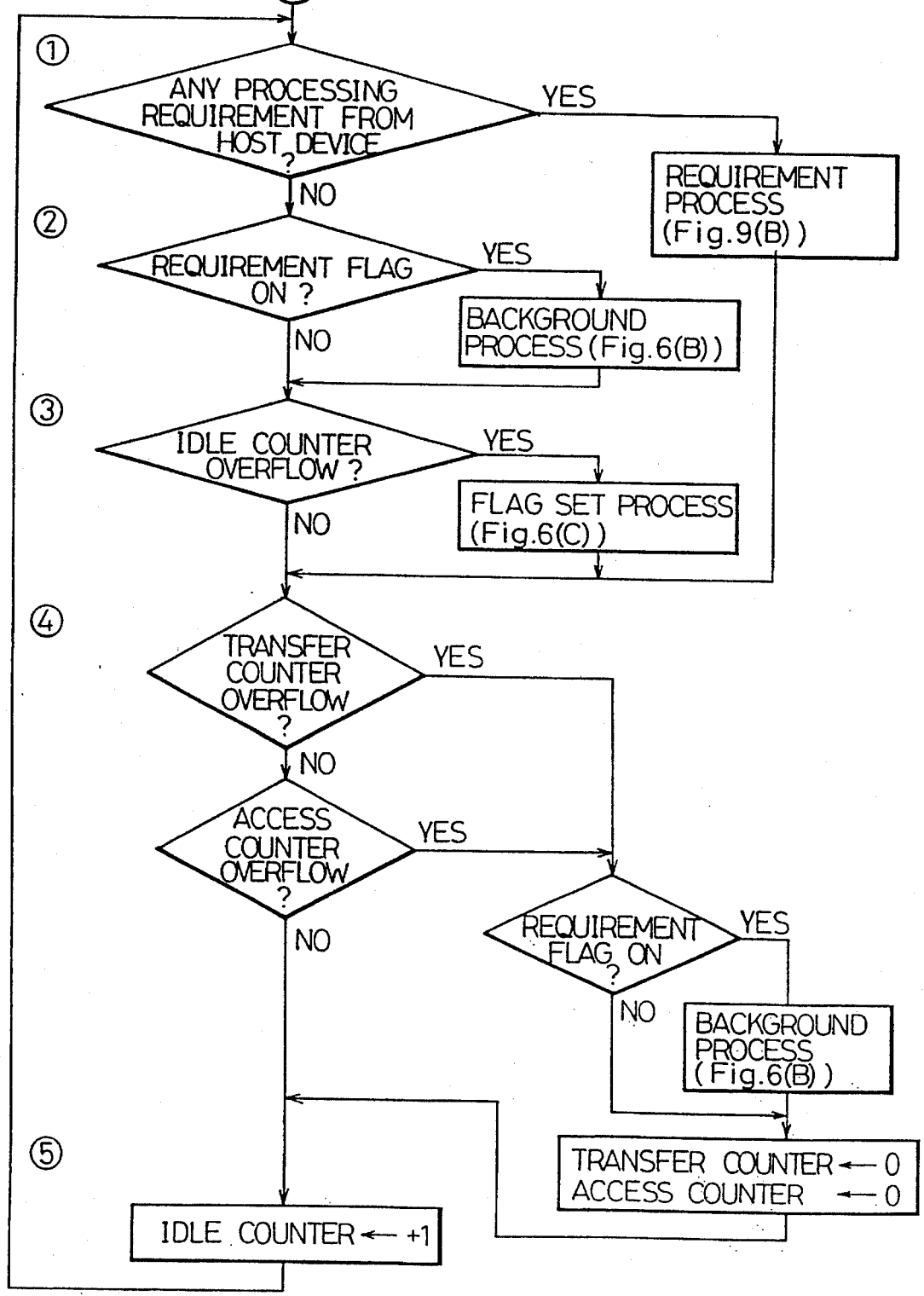
FIG. 9(A) and 9(B) are flowcharts for explaining a process shown in FIG. 8.
Figure 9:
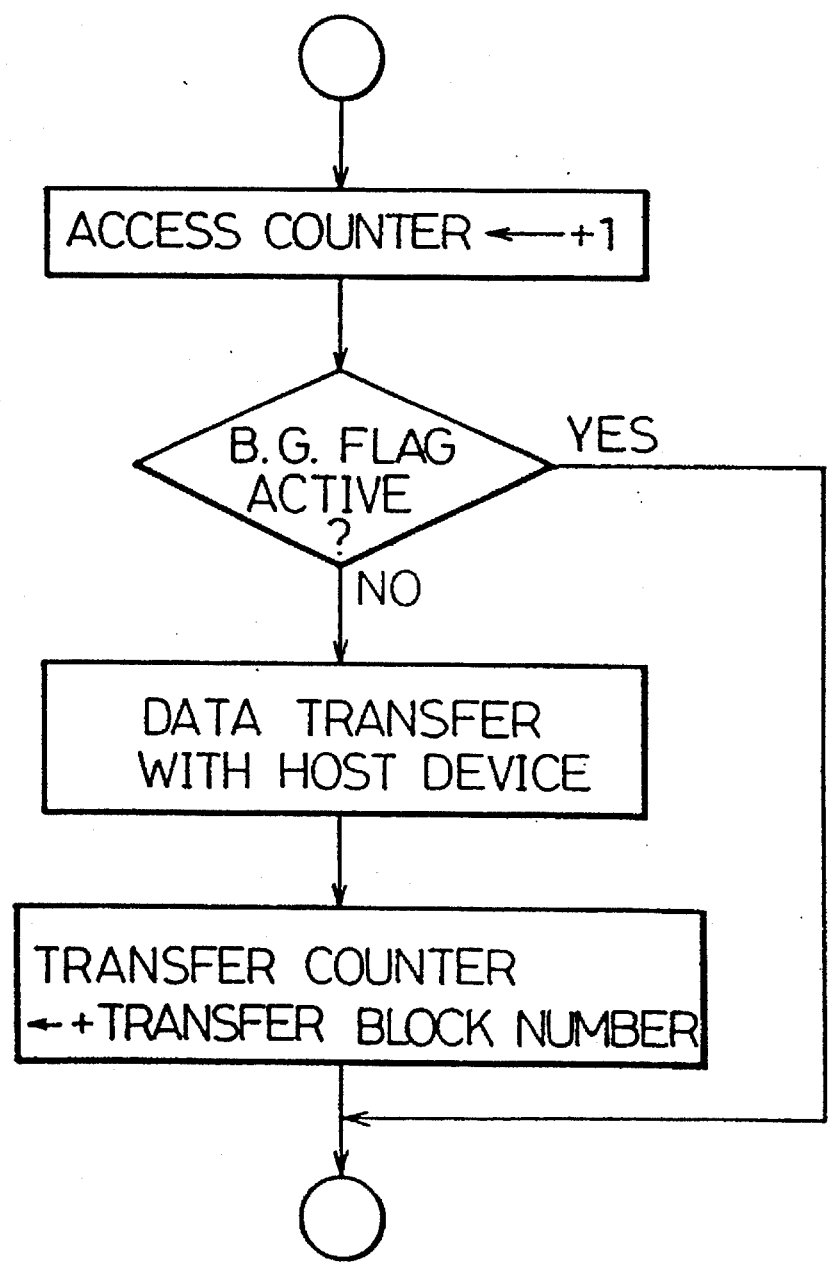

FIGS. 9(A) and 9(B) are flowcharts for explaining a process shown in FIG. 8.

These flow charts as in FIGS. 9(A) and 9(B) are similar to those of a first embodiment in FIGS. 5 and 6(A).

However, the former flowcharts are different from the latter flowcharts, in that the former flowcharts further include a step of checking whether or not the access counter 95 has overflowed, and the like steps.

Further, to facilitate understanding of a process according to a modification of the first embodiment, a description of the flowcharts will be given with reference to FIGS. 9(A) and 9(B).

(1) The processor 7 increments the content of the access counter 95 by one and discriminates whether or not any access requirement (command) is made by the host device 1 through the channel interface controller 4. If so, the processor 7 executes a requirement processing routine shown in FIG. 9(B) and proceeds to Step (4).

In the requirement processing routine in FIG. 9(B), the processor 7 checks the B.G. flag column in the device information table 90. If any of the devices is executing a background process, the processor 7 informs the host device 1 that the device is busy and exits this routine. On the contrary, if none of the devices is executing a background process, the processor 7 conducts the data transfer with the host device upon receipt of a command requiring a data transfer such as read and write commands, increments the content of the transfer counter 92 by one (one transfer block=4096 bytes), and exits this routine.

It will be appreciated that the content of the transfer counter 92 is not incremented in a transfer command to read the data stored in the magnetic disk array control unit 2 since the logical device is not used.

(2) On the other hand, if there is no access requirement from the host device 1, the processor 7 discriminates the receipt of the background requirement by checking the B.G. REQ flag 93. If the background requirement has been received, the processor 7 executes the background process shown in FIG. 6(B) described before and proceeds to Step (3). Here, with reference to FIGS. 6(B) and 6(C) again, the background process and flag setting process will be described once more.

In the background processing routine shown in FIG. 6(B), the processor 7 checks the B.G. flag column in the device information table 90. If any of the devices is executing a background process, the processor 7 exits this routine immediately. If none of the devices is executing a background process, the processor 7 sets a flag for those devices in the B.G. flag column of the device information table 90, and executes the background processing.

If the background process is, for example, a restoration process, the processor 7 brings the channel interface controller 4 into the CU BUSY state and informs the host device 1 that the device is busy upon receipt of an access request from the host device 1. The processor 7 further instructs the device interface controller 5 to execute one data restoration process, disconnects the interface controller 5 therefrom, and proceeds to Step (3).

The thus disconnected device interface controller 5, as descried above, reconstructs the data that was stored in the failed magnetic disk drive from the data stored on the magnetic disk drives 30 to 38 excluding the failed one, and stores the reconstructed data on the spare magnetic disk drive 39. The controller 5 reconstructs only a designated amount of data (by the track or by the cylinder) and, upon completion of one data reconstruction process, informs the processor 7 of completion of the interrupt routine.

(3) The processor 7 discriminates whether or not the idle counter 91 has overflowed (whether the content of the idle counter 91 is equal to or greater than a predetermined value n) if receiving no background requirement in Step (2) or after instructing execution of one data reconstruction process to the device interface controller 5. If the idle counter has overflowed, the processor 7 executes a flag set processing routine shown in FIG. 6(C) and proceeds to Step (4).

In the flag set processing routine shown in FIG. 6(C), the processor 7 scans the device controllers 60 to 69 through the device interface controller 5 so as to check whether or not there is a background processing requirement from the guest devices. If there is any, the processor 7 sets a flag in the B.G. REQ flag 93, resets the idle counter 91 because it has received the requirement, and exits this routine. The processor 7 resets the idle counter 91 even if there is no such requirement, and exits this routine.

(4) Subsequently, in Step (3), the processor 7 checks whether or not the transfer counter 92 has overflowed (whether the content of the transfer counter 92 is equal to or greater than a specified amount, e.g. several tens of thousands of cylinders) and whether or not the access counter 95 has overflowed, if the idle counter 91 has not overflowed, after the flag set processing routine is executed, or after the requirement processing routine is executed in Step (1). If the transfer counter 92 or the access counter 95 has overflowed, the processor 7 gives priority to the background processing upon the determination that the host device 1 has had sufficient access, and checks whether or not the flag is set in the B.G. REQ flag 93.

If the requirement flag is set, the processor 7 executes the background processing routine shown in FIG. 6(B), and resets the transfer counter 92 and the access counter 95. If the requirement flag is not set, the processor 7 resets the counter 92 and the access counter 95. Then, the processor 7 proceeds to Step (5).

(5) The processor 7 increments the content of the idle counter 91 by "1" because the processing program has made one run, and returns to Step (1).

Informed of completion of one background process from the guest device interface controller 5, the processor 7 resets active flags of the B.G. flags for corresponding devices in the device information table 90; resets the flag of the B.G. REQ flag 93; sets the flag of the B.G. END flag 94; and brings the channel interface controller 4 out of the CU BUSY state, thereby enabling the access from the host device 1.

In this case, the amount of data transferred to or from the host device is counted by means of transfer counter 92. Further, the access frequency of the host device is counted by means of access counter 95. When these counters 92 and 95 overflow, it is determined that the host device 1 has had access for a substantial amount of time and a time for the background process could not be obtained. Thereupon, the background process is prioritized over the access from the host device and is executed while informing the host device 1 that the logical devices are busy upon receipt of an access request from the host device 1.

Upon completion of the background process, the transfer counter 92 and the access counter 95 are cleared and the priority is given to the host device 1 again.

The reason the transfer counter 92 is not cleared in Step (2) is that the background process is executed because the spare time is available in the host device 1. Priority is still given to the host device 1 over the background process, but the background process is executed because there is no access being made by the host device 1.

More specifically, in this case, it is necessary to make the background process hold the right to change the order of priority based on the data transfer amount.

In this way, the host device 1 is normally prioritized, and the order of priority is changed when the data transfer amount to or from the host device reaches a predetermined amount, so as to prioritize the background process over the host device 1. In this way, the background process is executed while suppressing the influence on the access of the host device to a minimum level.

This prevents occurrence of a situation where the background process cannot be executed, when a huge amount of data is transferred to or from the host device 1, or when the access frequency of the host device is relatively high, and contributes to suppressing the influence on the access of the host device 1 to the minimum level.

Figure 10:
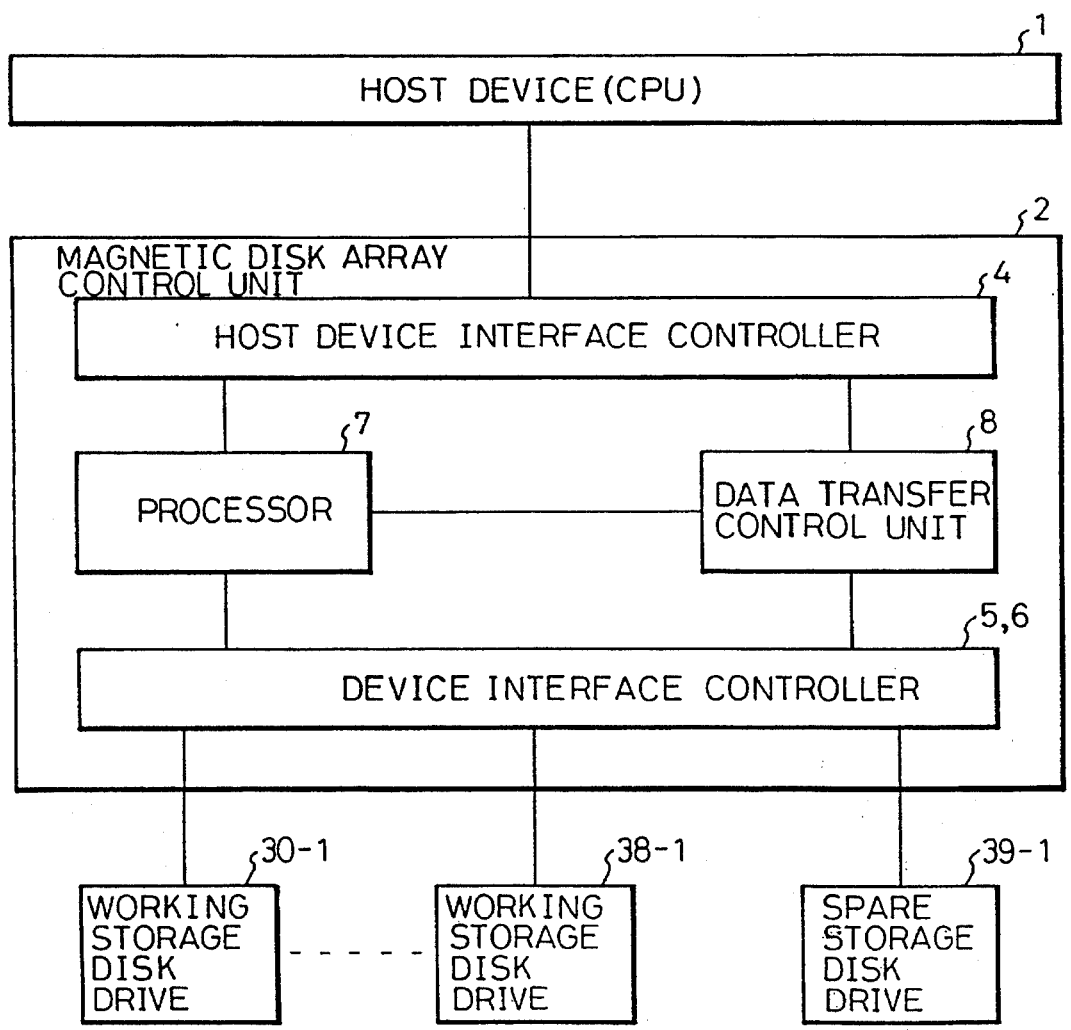
FIGS. 10(A) and 10(B) are a block diagram and a flowchart each showing an embodiment based on the second principle of the present invention.
Figure 10:
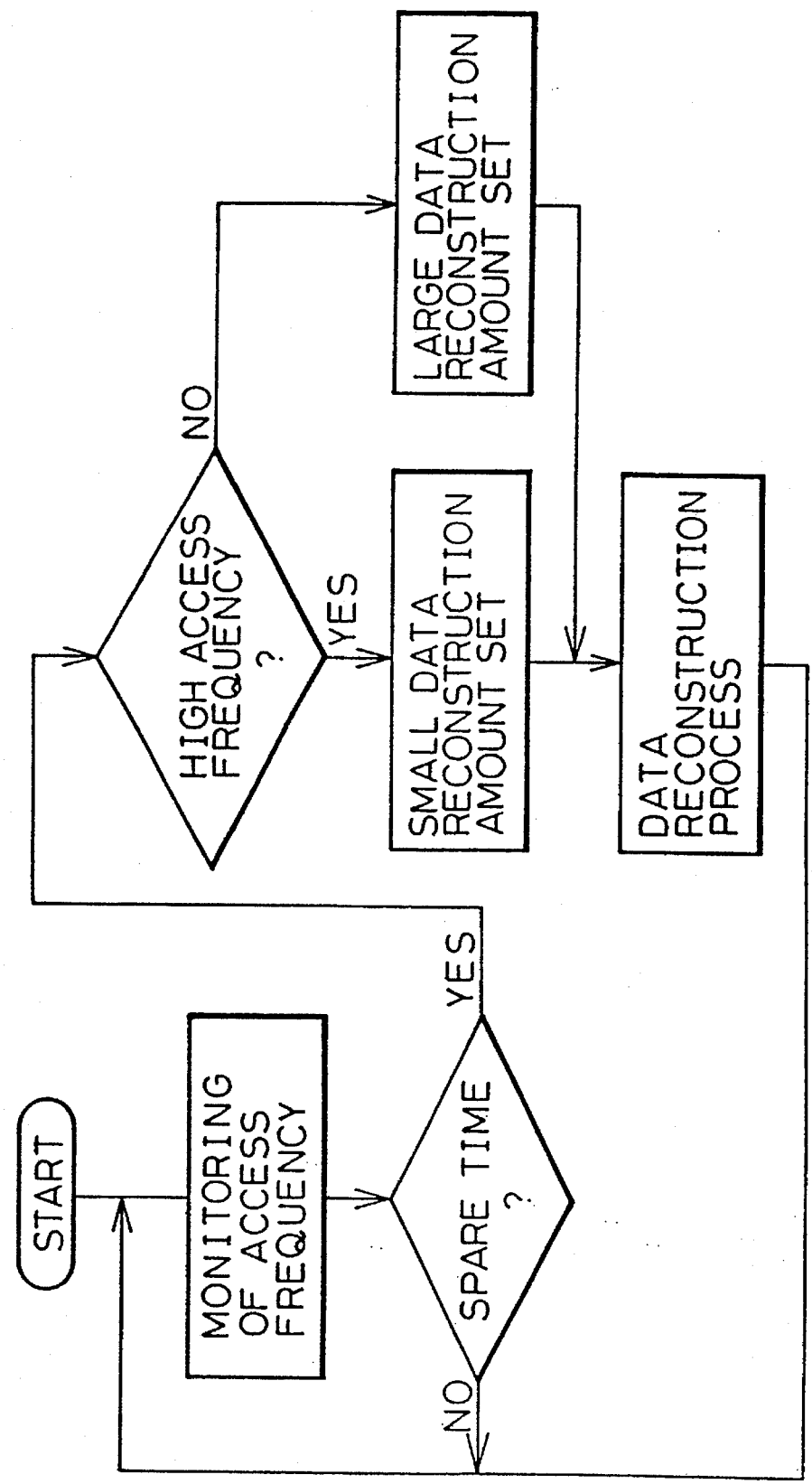

FIGS. 10(A) and 10(B) are block diagrams and a flowchart showing the second principle of the present invention.

FIGS. 10(A) and 10(B) are directed to a data reconstruction amount controlling process for a disk array device including a plurality of working storage disk drives 30 to 38, a spare storage disk drive 39, and a disk array control unit 2 which is connected in parallel with the plurality of working storage disks drives 30 to 38 and the standby storage disk drive 39 and which is adapted to access the plurality of working storage disk drives 30 to 38 in parallel when an access is made by a host device 1. Further, the disk array control unit 2, when a failure occurs in one of the working storage disk drives, reconstructs data stored in the failed working storage disk drives from store in other working storage disk drives, making use of spare time during which there is no access by the host device 1, and stores the reconstructed data in the spare storage disk drive 39. In this case, the disk array control unit 2 monitors an access frequency of the host device 1, and a data reconstruction amount is changed according to the access frequency until the spare time becomes available.

Further, the disk array control unit 2 sets a small data reconstruction amount when the access frequency of the host device 1 is high, while setting a large data reconstruction amount when the access frequency is low.

Further, the disk array control unit 2 sets a large data restore amount when a high access frequency state has been continued for more than a predetermined period even if the access frequency of the host device 1 is high.

Further, the disk array control unit 2 discriminates the presence or absence of an access requirement from the host device 1, determines that the spare time is available when the absence of the access requirement has been discriminated more than a specified number of times, and determines the access frequency based on a period which has elapsed before the absence of the access requirement has been discriminated more than the specified number of times.

Further, the array disk control unit 2 includes a host controller 4 for control of interfacing the disk array control unit 2 with the host device 1, device interface/device controller 5, 6 for controlling the storage disk drives 30 to 39 in a parallel manner, a data transfer controller 8 for transferring data between the host controller 4 and the device interface/device controllers 5, 6 and a main controller 7 for controlling these controllers. In this case, the main controller 7 is adapted to monitor the access frequency of the host device 1 and to designate to the device outerface/device controllers 5, 6 a data reconstruction amount according to the access frequency until the spare time is available, and the device interface/device controllers 5, 6 are adapted to carry out a data reconstruction process for the data reconstruction amount.

Further, the main controller 7 includes an idle counter 91 for counting the occurrences of absence of access of the host device 1, discriminating the presence or absence of access requirements from the host device 1, determining that the spare time is available when a value of the idle counter 91 exceeds a predetermined value, and determines the access frequency based on a period which has elapsed until the value of the idle counter 91 exceeds the predetermined value.

Further, the main controller 7 sets a small data reconstruction amount when a long period has elapsed before the value of the idle counter 91 exceeds the predetermined value, and sets a large data reconstruction amount when a short period has elapsed before the value of the idle counter 91 exceeds the predetermined value.

Further, the main controller 7 includes a high access counter 92 for counting the number of times when the access frequency of the host device 1 is high, and setting a large data reconstruction amount when a value of the high access counter 92 exceeds a predetermined value.

As shown in FIGS. 10(A) and 10(B), the disk array control unit 2 monitors the access frequency of the host device 1 and changes the data reconstruction amount according to the access frequency until the spare time is available. Accordingly, both the access of the host device 1 and the data reconstruction process can be efficiently carried out by changing the data reconstruction amount according to the access frequency of the host device 1.

Further, the disk array control unit 2 sets a small data reconstruction amount when the access frequency of the host device 1 is high, and sets a large data reconstruction amount when the access frequency is low. Accordingly, the data reconstruction amount can be changed according to the level of the access frequency, thereby being controlled easily.

Further, the disk array control unit 2 sets a large data reconstruction amount when the high access frequency state has continued for more than the predetermined period even if the access frequency of the host device 1 is high. If the high access frequency state is continued, the data restore amount is continued to be set small, causing a longer data reconstruction time. Thus, in this case, a large data reconstruction amount is forcibly set, causing the host device to wait temporarily so as to make the host device 1 compatible with the data reconstruction.

Further, the disk array control unit 2 discriminates the presence or absence of an access requirement from the host device 1, determines that the spare time is available when the absence of the access requirement has been discriminated more than a specified number of times, and determines the access frequency based on a period which has elapsed before the absence of the access requirement has been discriminated more than the specified number of times. Thus, the disk array control unit 2 can determine the access frequency easily.

Further, the disk array control unit 2 includes a host controller 4 for control of interfacing the disk array control unit 2 with the host device 1, device interface/device controllers 5, 6 for controlling the storage disk devices 30 to 39 in parallel, a data transfer controller 8 for transferring data between the host controller 4 and the device interface/device controllers 5, 6, and a main controller 7 for controlling these controllers. In this case, the main controller 7 is adapted to monitor the access frequency of the host device 1 and to designate to the device interface/device controllers 5, 6 a data reconstruction amount according to the access frequency until the spare time is available, and the device interface/device controllers 5, 6 are adapted to carry out a data reconstruction process of the data reconstruction amount. Thus, the disk array control unit 2 can control the data reconstruction amount without being influenced by the access of the host device 1.

Further, the main controller 7 includes an idle counter 91 for counting the occurrences of absence of access of the host device 1, discriminating the presence or absence of access requirement from the host device 1, determining that the spare time is available when a value of the idle counter 91 becomes in excess of a predetermined value, and determining the access frequency based on a period which has elapsed until the value of the idle counter 91 exceeds the predetermined value. The access frequency can be determined based on a counting operation of the idle counter 91, and accordingly determination can be made with a simple construction.

Further, the main controller 7 sets a small data reconstruction amount when a long period has elapsed before the value of the idle counter 91 exceeds the predetermined value, and sets a large data reconstruction amount when a short period has elapsed before the value of the idle counter 91 exceeds the predetermined value. Thus, the data reconstruction amount can be controlled easily.

Further, the main controller 7 includes a high access counter 92 for counting the number of times when the access frequency of the host device 1 is high, and setting a large data reconstruction amount when a value of the high access counter 92 exceeds a predetermined value. If the high access frequency state is continued, the data reconstruction amount is continuously set small, resulting in a longer time for reconstructing data. However, with the high access counter 92, the large data reconstruction amount is forcibly set in this case, causing the host device 1 to wait temporarily so as to make the host device 1 compatible with data reconstruction.

Figure 11:
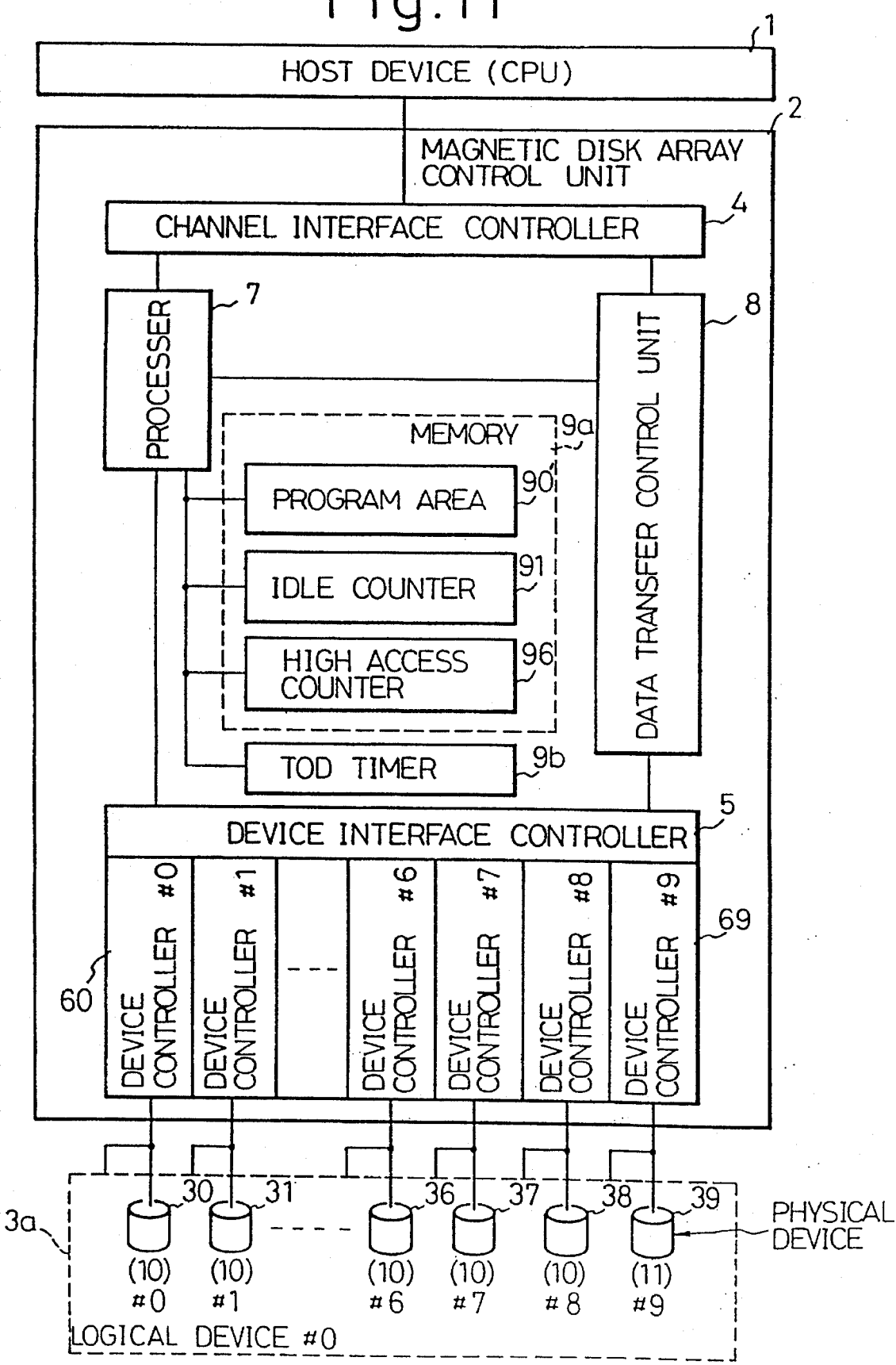
FIG. 11 is a block diagram of a second exemplary embodiment according to the present invention.
Figure 12:
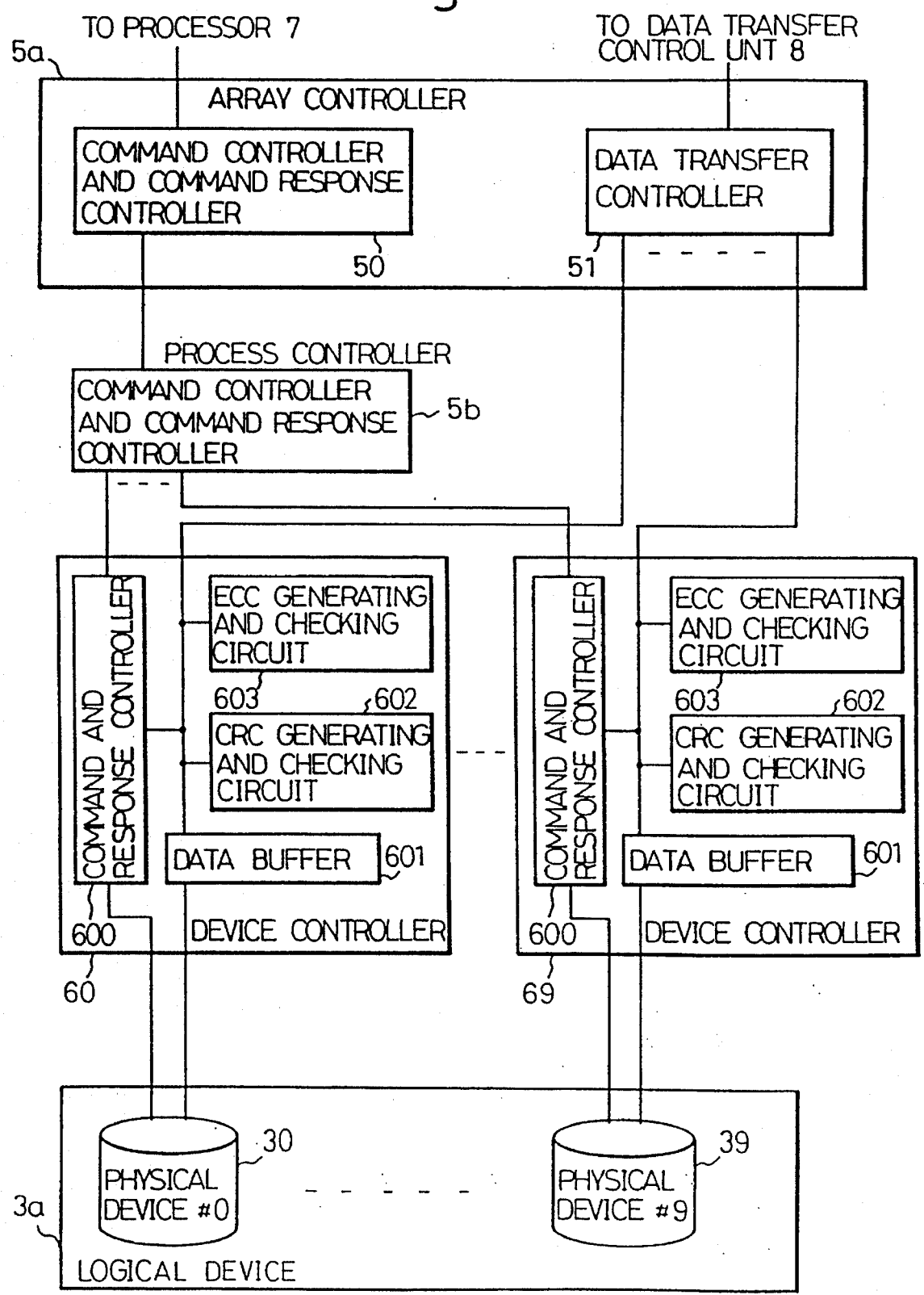
FIG. 12 is a block diagram of a guest interface controller of FIG. 11 in more detail.

FIG. 11 is a block diagram of a second exemplary embodiment of the present invention, and FIG. 12 is a block diagram of a guest interface control unit in the embodiment of FIG. 11. FIGS. 11 and 12 show an array type magnetic disk system.

In FIG. 11, a magnetic disk array control unit 2 is provided with a control storage (memory) 9a and a TOD timer 9b serving as a clock in addition to a channel interface controller 4, a device interface controller 5, device controllers 60 to 69, and a processor 7.

The control storage 9a includes a program area 90' for storing a program, an idle counter 91 for counting an idle number, and a high access counter 96 for counting the number of high access times of a host device.

In the illustrated embodiment, a logical device 3a including magnetic disk drives 30 to 39 is connected to the device controllers 60 to 69. However, a plurality of logical devices are in fact connected to the device controller 60 to 69 as in an example shown FIG. 1.

The guest device interface controller 5 includes, as shown in FIG. 12, an array controller 5a and a process controller 5b for controlling the respective device controllers 60 to 69, for grasping states of controllers 60 to 69 by receiving responses and for giving a response.

The array controller 5a includes a command controlling and responding unit 50 for controlling a data transfer controller 51 and the process controller 5b upon receipt of a command from the processor 7, and for responding to the processor 7. Further, the array controller 5a includes and the data transfer controller 51 for adding parity data to the data transferred from the host device 1, distributing the data added with the parity data to the respective device controllers 60 to 69, conducting parity checks for the data from the device controllers 60 to 69 using the parity data thereof, transferring the checked data to the host device 1, and reconstructing the data upon receipt of an instruction requesting reconstruction of the data.

Each of the device controllers 60 to 69 includes a command and response controller 600 for controlling the magnetic disk drives 30 to 39 according to a command from the processing controller 5b and for giving a response to the process controller 5b, a data buffer 601 for storing data to and from the magnetic disk drives 30 to 39, a CRC generating and checking circuit 602 for generating CRC data for each block (512 bytes) of data to be written (write data) and checking the CRC data for each block of data to be read (read data), and an ECC generating and checking circuit 603 for generating an ECC (error correcting code) for each block of white data (including the CRC data) and checking the ECC for each block of read data (including the CRC data).

Figure 13:
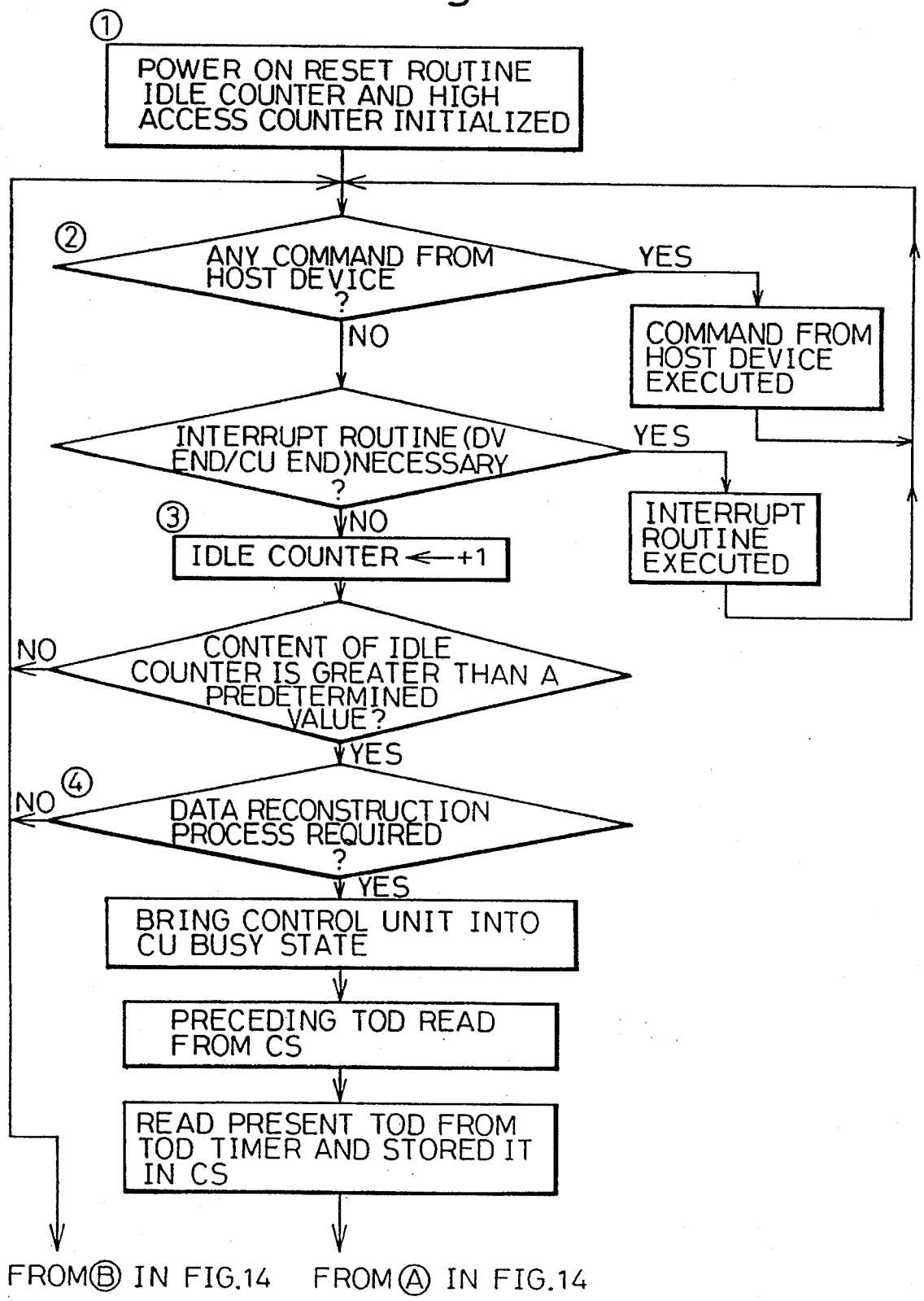
FIG. 13 is a flowchart for explaining a first half of a process of a second embodiment according to the present invention.
Figure 14:
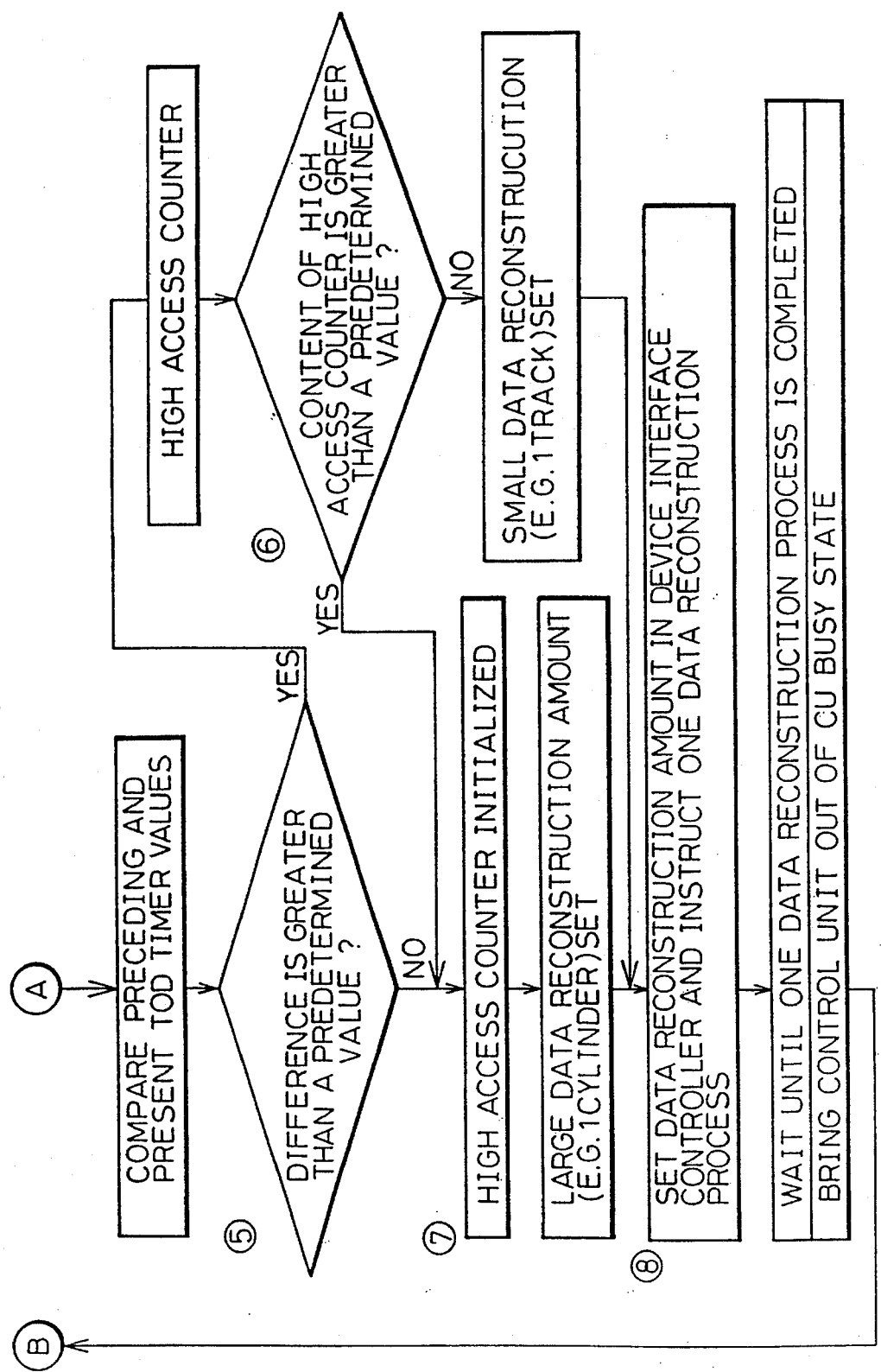
FIG. 14 is a flowchart for explaining a second half of a processing of a second embodiment according to the present invention.
Figure 15:
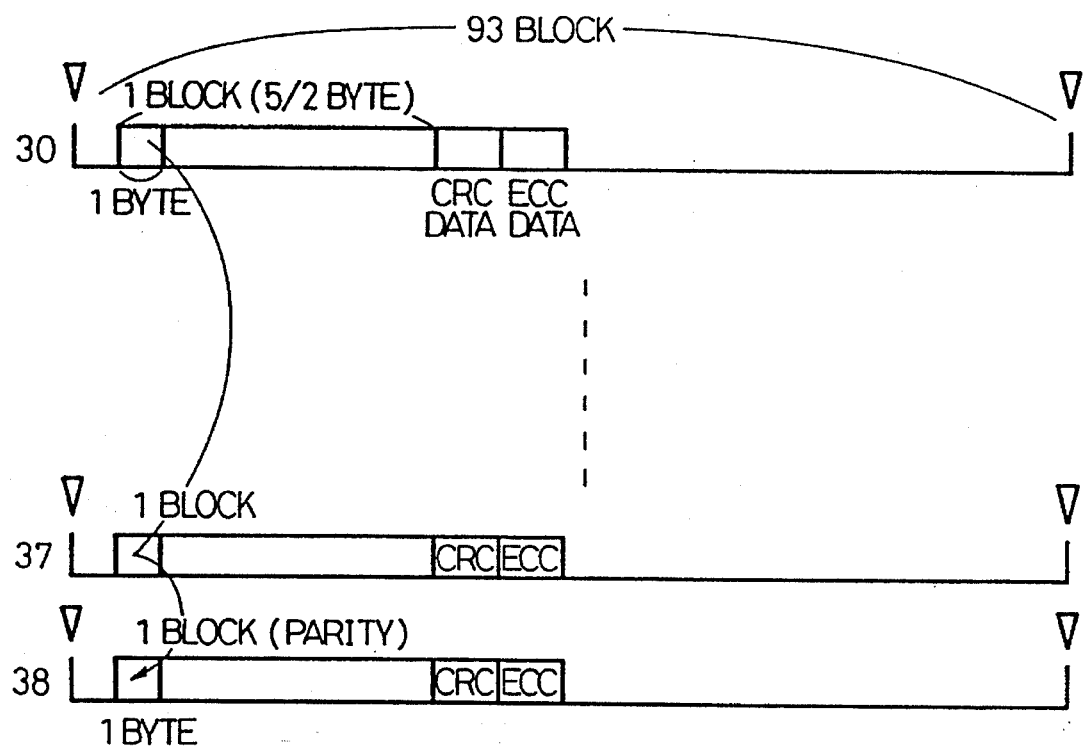
FIG. 15(A) and 15(B) are time charts for explaining an operation of a second embodiment according to the present invention.
Figure 15:
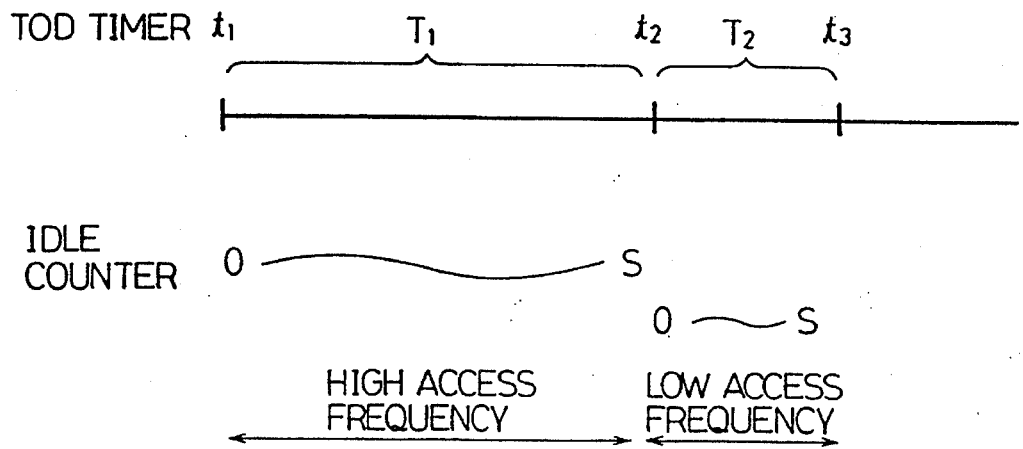

FIGS. 13 and 14 are flowcharts showing a process of a second embodiment of the present invention, and FIGS. 15(A) and 15(B) are time charts for explaining an operation of the second embodiment.

First of all, a normal access operation of the host device 1 will be described.

For example, at the time of a read access from the host device 1, the processor 7 sends a read command to the command and response controller 50 of the array controller 5a of the device interface controller 5, and instructs the process controller 5b to cause the respective magnetic disk drives 30 to 38 to carry out a seek operation to read cylinder positions by controlling the device controllers 60 to 69. Upon completion of the seek operation, a device operation end is informed to the processor 7, and thereby the processor 7 enters a transfer control.

The processor 7 activates the data transfer control unit 8 and the channel interface controller 4. Further, the command and response controller 50 activates the data transfer controller 51. Thereafter, the desired blocks of data stored on the magnetic disk drives 30 to 38 are read through the device controllers 60 to 68; the parity check is applied to the read data; and the data from the eight magnetic disk devices are reconstituted to be transferred to the host device 1 through the data transfer control unit 8 and the channel interface controller 4.

If, for example, a unit of data to be transferred simultaneously is 4096 bytes, one block (512 bytes) of data is stored in each of the magnetic disk drives for data 30 to 37. One track is constituted by 93 blocks FIG. 15(A).

One bit of parity data is generated each for 8 bits of data at the same bit position for 512 bytes data stored in each of the eight magnetic disk devices for data 30 to 37. Accordingly, for 4096 bytes of data, 512 bytes of parity data are stored in one block of the magnetic disk drive for parity data 38.

On the other hand, in the device controllers 60 to 68 for the magnetic disk drives 30 to 38, the CRC data is added to each block (512 bytes) of data, and the ECC is added to one block of data (including the CRC data). When the data is read, the CRC generating and checking circuit 602 checks the CRC data for each block of data, and the ECC generating and checking circuit 603 checks the ECC for each block of data (including the CRC data).

As described above, in the magnetic disk drives 30 to 38, a CRC check and an ECC check are applied to each block of data, and in the data transfer controller 51, the parity check is applied to the data from the magnetic disk drives 30 to 37 using the parity data from the magnetic disk drive 38.

Next will be described a process of the embodiment next with reference to FIGS. 13 and 14.

(1) When the disk array device is powered on, a power-on reset process is executed including initializing of the idle counter 91 and the high access counter 96.

(2) The processor 7 discriminates whether or not any access requirement (command) is made from the host device 1 through the channel interface controller 4. If there is an access requirement (command), the processor 7 executes the command from the host device 1, and returns to the preceding step so as to discriminate whether or not there is an access requirement (command) from the host device 1.

If there is no access requirement from the host device 1, the processor 7 discriminates whether there is a device end (DV END) interrupt from the device interface controller 5 or a control unit end (CU END) interrupt from the channel interface controller 4. If there is such an interrupt, the processor 7 executes the interrupt handling routine and returns to the preceding step so as to discriminate whether or not there is any access requirement (command) from the host device 1.

(3) If there is neither the device end (DV END) interrupt nor the control unit end (CU END) interrupt, the processor 7 determines that processing spare time is available. Then, the processor 7 increments the content of the idle counter 91 of the memory 9a by one, and compares the content of the idle counter 91 (spare processing time) with a predetermined value S. If the content of the idle counter 91 does not exceed the predetermined value S, the processor 7 returns to Step (2).

(4) When the content of the idle counter 91 exceeds the predetermined value S, it means that spare the processing time is in excess of the predetermined value S. Accordingly, the processor 7 discriminates whether or not a reconstruction process is necessary.

The device interface/device device interface controller 5 gives a reconstruction processing requirement to the processor 7 when a read error or the like occurs in one of the magnetic disk drives more than a specified number of times as described above.

The processor 7 discriminates whether or not there is a reconstruction processing requirement from the device interface controller 5, and returns to Step (2) if there is no such requirement.

On the other hand, upon determining that there is a reconstruction processing requirement from the device interface controller 5, the processor 7 brings the channel interface controller 4 to a CU BUSY state, thereby prohibiting receipt of access from the host device 1. In addition, the processor 7 reads a time (TOD) of the TOD timer 9b read in the preceding cycle from the program area 90' of the memory 9a; reads a present time (TOD) of the TOD timer 9b; stores the present time (TOD) in the program area 90' of the memory 9a; and compares the TOD timer value in the preceding cycle with the one in the present cycle.

(5) The processor 7 calculates a difference between the preceding TOD timer value and the present TOD timer value, and compares the calculated value with a predetermined value (time interval) TS.

This operation is described with reference to FIG. 15(B). If the preceding TOD timer value (time) is set at t1 and the present TOD timer value (time) is set at t2, the difference T1 indicates a time interval during which the content of the idle counter 91, i.e., spare processing time, reaches the predetermined value S.

Accordingly, a long time interval T1 indicates frequent accesses and little likelihood of providing the spare processing time, and therefore the host device 1 is determined to have a high access frequency. Conversely, a short time interval T2 indicates fewer accesses and a high likelihood of providing the spare processing time periodically, and therefore the host device 1 is determined to have a low access frequency.

Thus, if the time interval, which is the difference between the preceding and the present TOD timer values is greater than the predetermined value TS, the host device is determined to have a high access frequency. On the other hand, if the time interval, which is the difference between the preceding and the present TOD timer values, is not greater than the predetermined values TS, the host device is determined to have a low access frequency.

Upon determining that the host device has a high access frequency, the processor 7 increments the content of the high access counter 96 of the memory 9a by one.

(6) Subsequently, the processor 7 compares the content of the high access counter 96 with a predetermined value A and discriminates whether the content of the high access counter 96 exceeds the predetermined value A.

If the content of the high access counter 92 exceeds the predetermined value A, the processor 7 proceeds to Step (7) since the high access frequency has been continued. On the contrary, if the content of the high access counter 96 does not exceed the predetermined value A, the processor 7 sets the data reconstruction amount during one reconstruction process to a small value (e.g., one track) so as to execute a reconstruction process without causing the host device 1 to wait because the high access frequency is continued, and then proceeds to step (8).

(7) On the other hand, if it is determined that the host device has a low access frequency in Step (5), or if it is determined that the high access frequency has been continued in Step (6), the processor 7 initializes the content of the high access counter 96 (i.e., resets it to 0); sets the data reconstruction amount during one reconstruction process to a large value (e.g., one cylinder) so as to execute the reconstruction processing sufficiently; and proceeds to Step (8).

(8) The processor 7 sets the data reconstruction amount in the device interface controller 5, and instructs execution of one data reconstruction to the device interface controller 5.

Upon receipt of the instruction, the device interface controller 5 reconstructs the data in the failed magnetic disk drive based on the data stored in the magnetic disk drives 30 to 38 excluding the failed one as described above, and sets the reconstructed data in the spare magnetic disk drive 39. The device controller 5 reconstructs the data of the set amount, and completes the one data reconstruction processing for one cycle.

The processor 7 waits until one data reconstruction process is completed. Upon completion of the one data restoration process, the processor 7 brings the channel interface controller 4 out of the CU BUSY state, permits receipt of an access from the host device 1, and returns to Step (2).

In this way, the access frequency of the host device 1 is monitored in executing the data reconstruction processing during the spare processing time of the disk array control unit 2, and the data reconstruction amount is controlled according to the access frequency, thereby improving efficiency of the access of the host device 1 and the reconstruction process.

Further, if the access frequency is high, the data reconstruction amount is set to a small value so as not to cause the host device 1 to wait for a long time. On the contrary, if the access frequency is low, the data reconstruction process is prioritized and the data reconstruction amount is set to a large value since there are fewer accesses from the host device 1. Accordingly, the complete data reconstruction process can be executed in a short time without causing the host device 1 to wait.

Moreover, if the high access frequency has been continued, the data reconstruction is delayed, which results in a delayed access time of the host device 1. Therefore, in this case, the data reconstruction amount is set to a large value, causing the host device 1 to wait temporarily so that the data reconstruction can be completed rapidly.

Further, since the idle number is counted so as to detect the spare processing time and the access frequency, these detections can be made by a simple process.

In addition to the foregoing second embodiment, the invention can be modified in the following manner.

(1) Although the invention is described with respect to a disk array device provided with the magnetic disk devices in the foregoing embodiment, the invention is applicable to a disk array device provided with optical disk drives or like disk drives having mechanical operation.

(2) In the foregoing embodiment, the idle number is counted to detect the access frequency. However, it may be appropriate to count an access number of the host device and determine the access frequency in the spare processing time based on the counted access number. Further, in the foregoing embodiment, the access frequency is determined based on the time interval determined when the idle number reaches a predetermined value. However, the access frequency may be determined from the idle number in each specified cycle.

(3) Although there is provided one spare disk drive in the foregoing embodiment, two or more spare disk drives may be provided.

While the invention is described as related to the first and second embodiments, various changes and modifications may be made in the invention without departing from the spirit and scope thereof.

As described above, the second embodiment demonstrates the following effects.

(1) A disk array control unit 2 monitors an access frequency of a host device 1 and changes a data reconstruction amount according to the access frequency until spare time becomes available. Accordingly, the data reconstruction amount can be changed according to the access frequency of the host device 1, thereby enabling efficient execution of the access of the host device 1 and the data reconstruction process.

(2) Since the reconstruction process can be executed in a short time without causing the host device to wait for a long time, the reconstruction process can be completed without affecting the processing of the host device very much and the disk array device can return to its principle performance. Therefore, a processing speed of an entire system is reduced only during a short period in the event of a failure of a storage disk drive.

Figure 16:
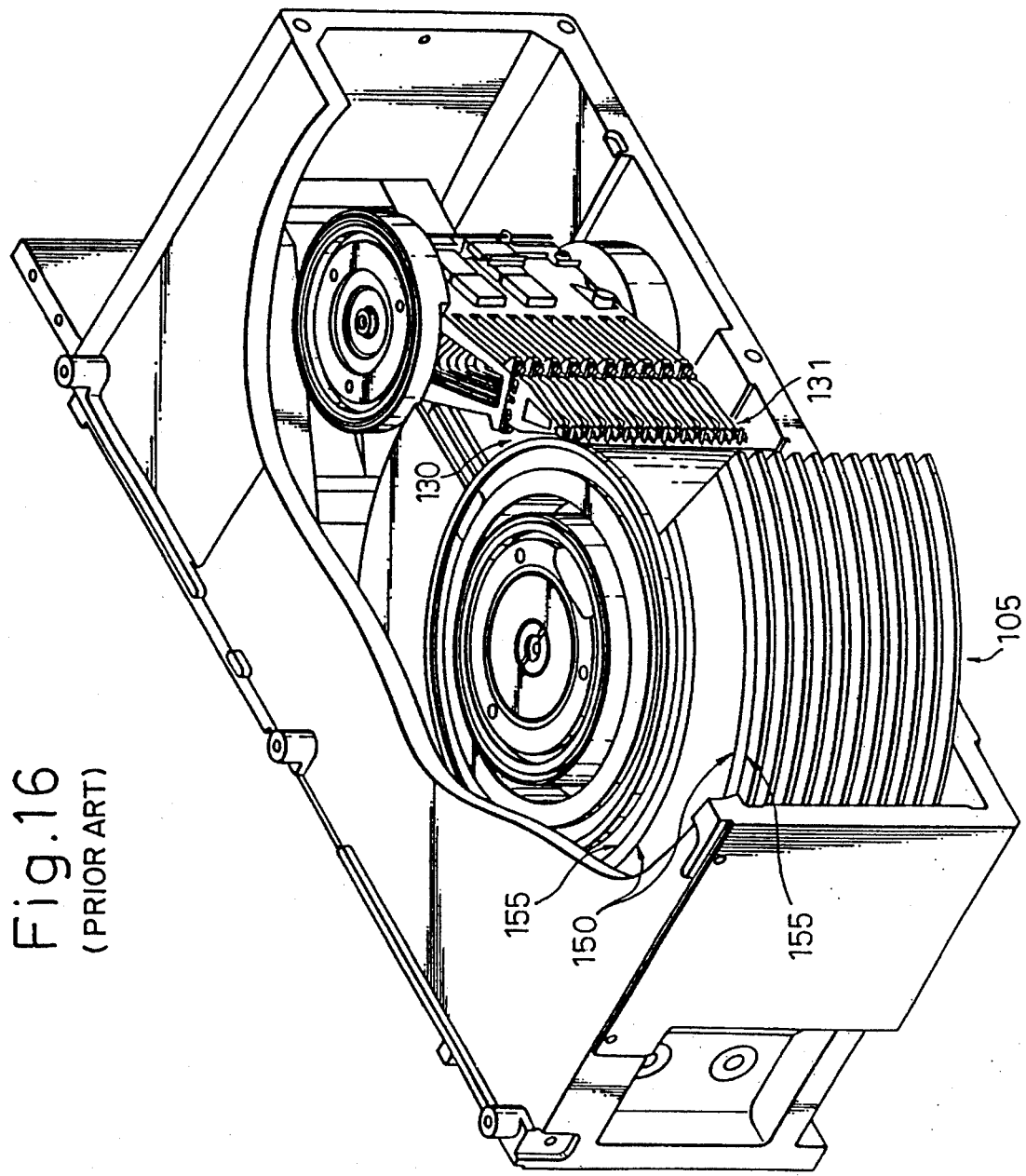
FIG. 16 is a perspective view, partially cut away, showing a mechanism of a magnetic disk drive.

Here, in order to facilitate understanding of the embodiments according to the present invention, a perspective view, partially cut away, showing a mechanism of one magnetic disk drive is illustrated in FIGS. 16. As seen from this figure, a plurality of disks (e.g., eleven disks) 105 are rotated simultaneously. The tracks on a recording surface of each disk 105 are written with a predetermined data pattern. However, the tracks at both ends of the inner zone and the outer zone of the disk 105 are formed as guard bands 150 in which a particular pattern is written, instead of a data pattern, which particular pattern is used for stopping a seek operation of two kinds of heads 130 and 131. The heads 130, 131 are provided on the upper and lower surfaces of each disk 105. Further, at the inner and the outer sides of the guard band 150, an erase zone 155 is formed for mechanically stopping the heads 130 and 131.

Figure 17:
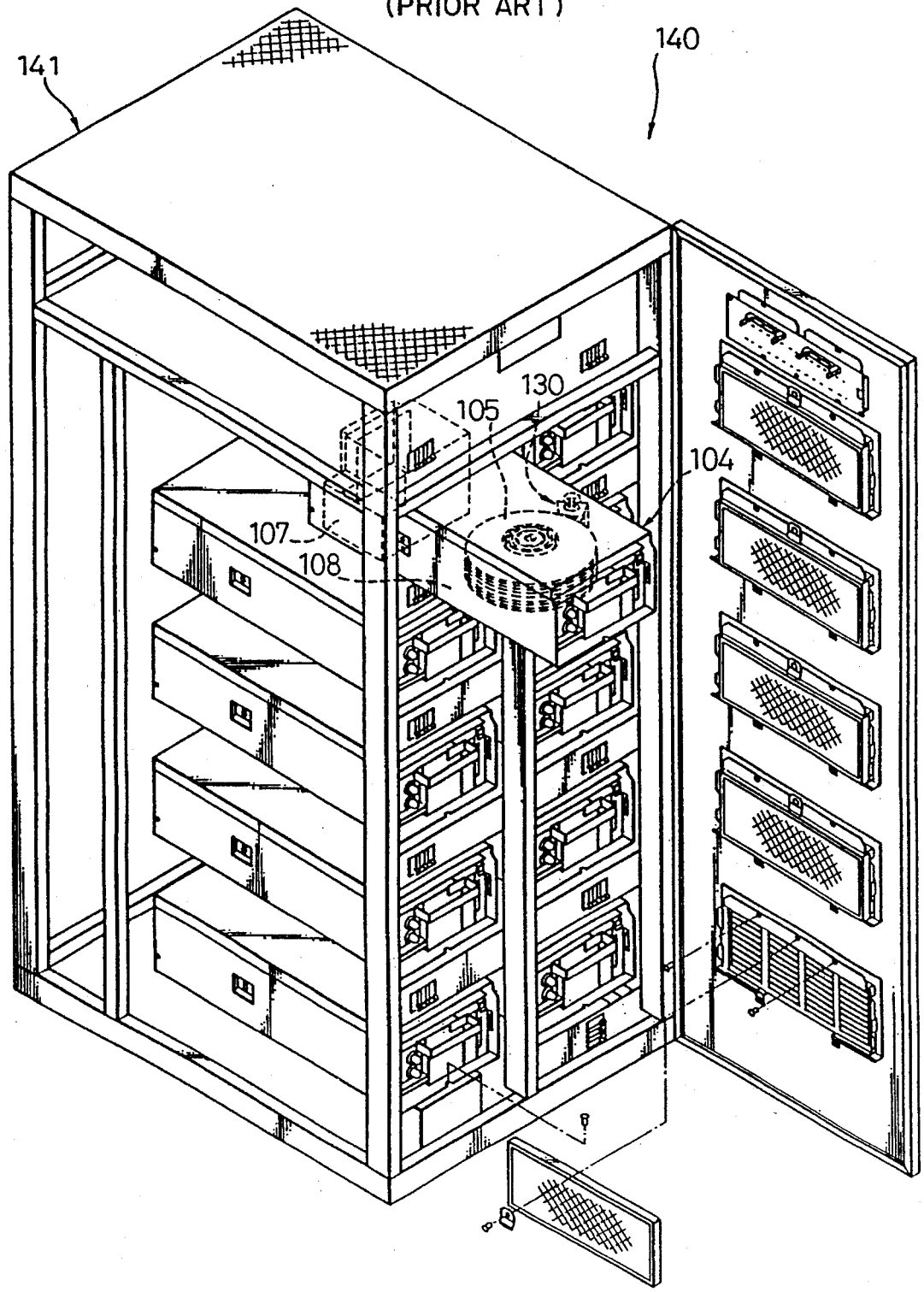
FIG. 17 is an overall perspective view showing a magnetic disk array device.

Preferably, the present invention is incorporated in a disk array device 140 as shown in FIG. 17, wherein reference numeral 104 denotes a magnetic disk drive that includes the disks 105 and 141 denotes a housing that can accommodate a plurality of magnetic disk drives. In this case, the disk array device are composed of eight disk drives for data transfer, one parity disk drive and one spare storage disk drive.

The magnetic disk drives 104 constituting each unit of a disk array device comprise a disk enclosure 108. The disk enclosure 108 serves to contain the disks 105 and the peripheral circuit module 107 inside the disk enclosure 108 per se.

Each magnetic disk drive 104 is constructed to be easily inserted into the housing 141 and also easily removed therefrom, so that a maintenance operation can be rapidly performed when a failure, etc., has occurred.

Figure 18:
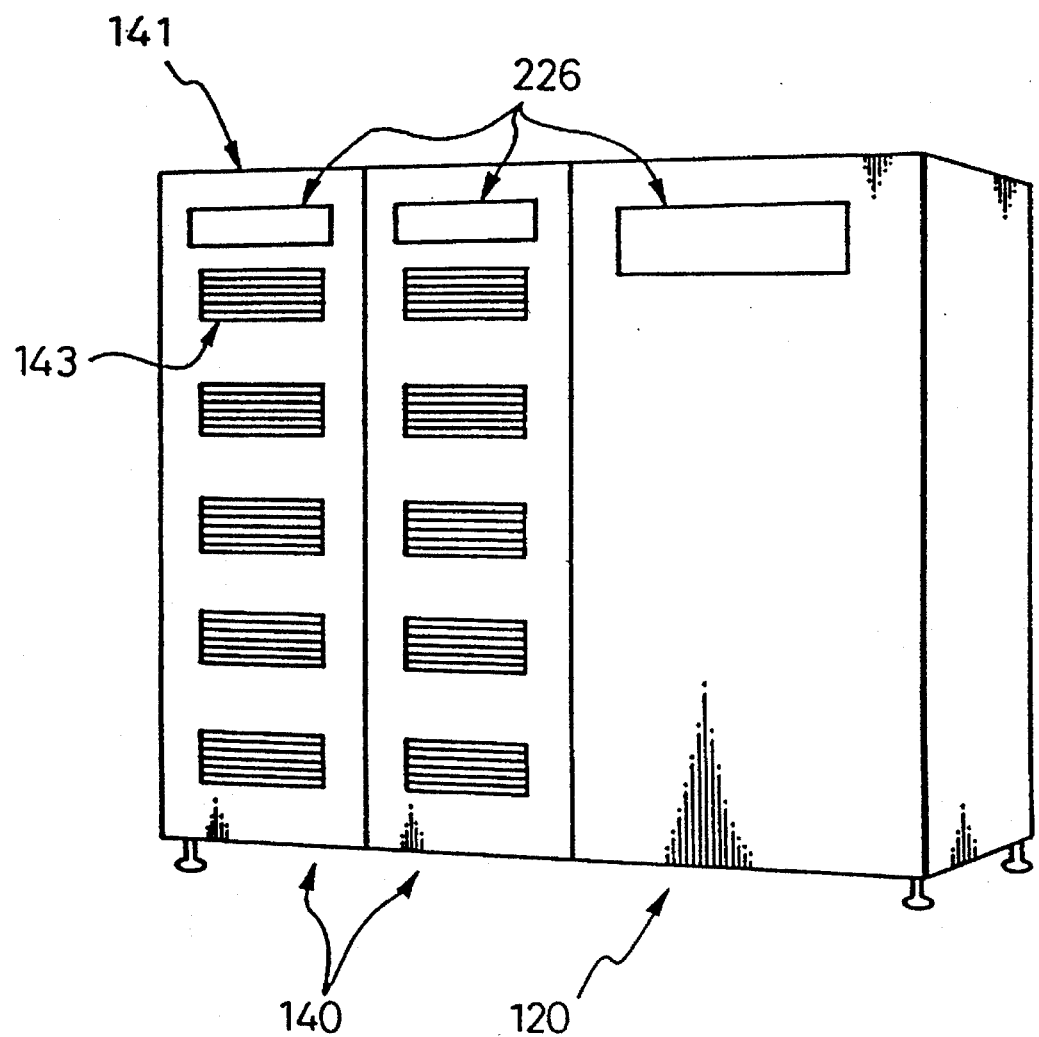
FIG. 18 is a perspective view showing an appearance of a plurality of disk array devices to which the present invention is applied.

Further, in order to clarify the whole construction of a disk array system to which the present invention is applied, an appearance of a plurality of disk array devices including the operation panel 226 is illustrated in FIG. 18.

In FIG. 18, a disk array system is constituted by a plurality of disk array devices, e.g., two disk array devices 140 and a disk array control unit 120 for controlling these disk array devices 140. The two disk array drives 140 and the disk controller are arranged to be contained in a housing 141. In this case, the front side of the housing 141 at each disk array device 140 is provided with the operation panel 226, in addition to a plurality of ventilation windows 143 for radiating heat generated from a plurality of disk drives (not shown in FIG. 18). Further, the front side of the housing 141 at the disk controller 120 is also provided with the operation panel 226.

Figure 19A:
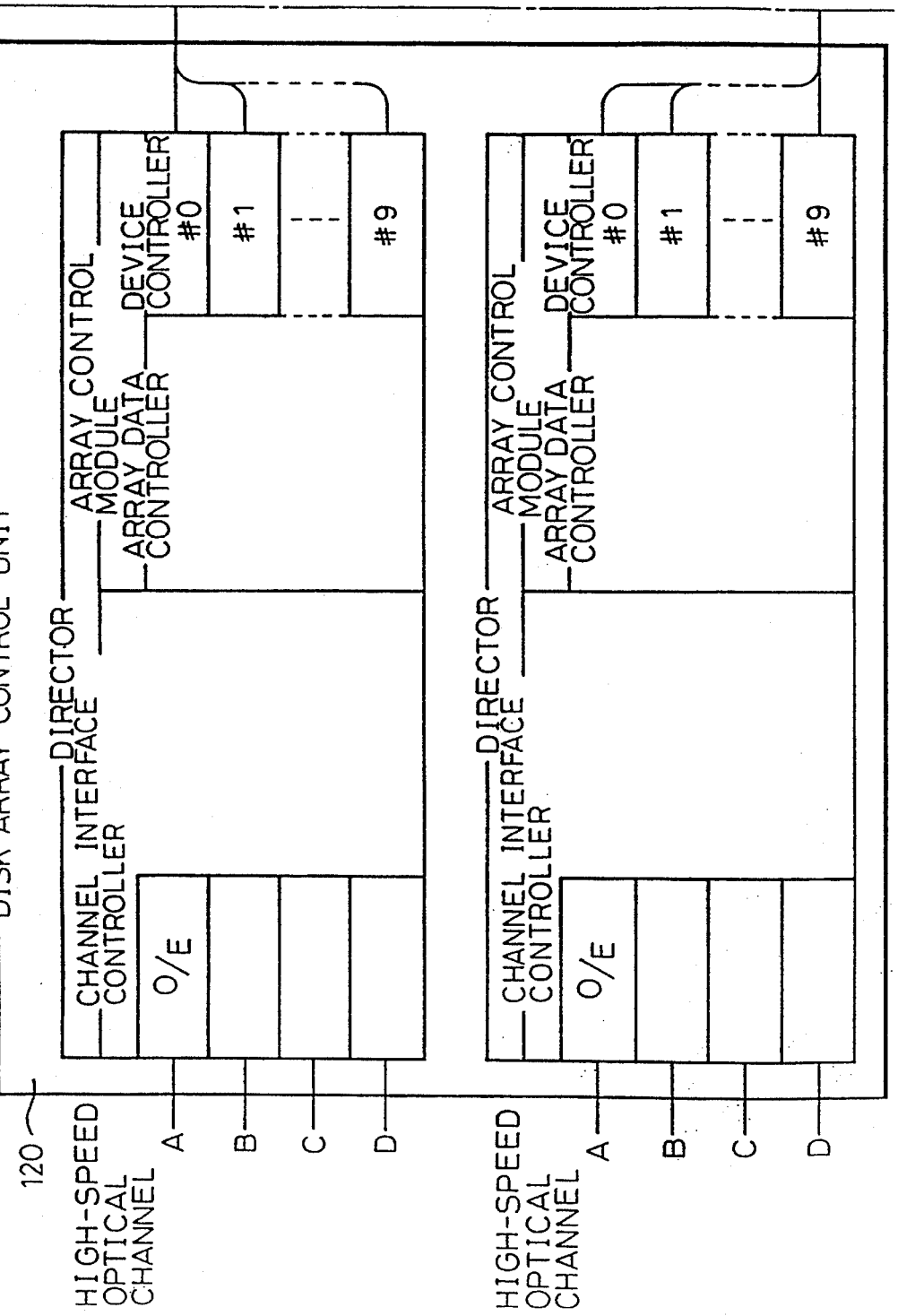

Finally, block diagrams of a disk array control unit 120 and a plurality of disk array devices 140 controlled by the disk array control unit 120 are illustrated in FIGS. 19(A) and 19(B), respectively. In this case, eight disk drives at the maximum can be controlled by the disk controller 120 having a plurality of directors.

In FIG. 19(A), high-speed optical channels A, B, C and D, and channel interface controllers, e.g., high-speed optical control modules each functioning as an optical/electric interface (O/E interface), are provided to enable data to be transferred at high speed between the channel and the disk array devices 140. The disk array control unit 120 consists of two directors. Each director consists of two modules: the optical control module as described above; and an array control module to control the disk array devices 140.

The latter module is divided into ten device controllers to control the respectively corresponding disk drives (Drive 0–7, Drive P and Drive S as shown in FIG. 19(B)) and an array data controller to transfer the data to or from each of the device controllers.

The two directors in the disk array control unit are independent of each other. These directors can control two groups of disk array devices simultaneously.

In this case, the operation panel 226 (FIG. 18) can display the status information of each of two disk array display the status information of each of two disk array devices.

We claim:

1. An apparatus for controlling a background process in a disk array device including a plurality of storage disk drives comprising:

a disk array control unit for accessing said plurality of storage disk drives in parallel when a command for an access is issued from a host device, and for executing a background process for said plurality of storage disk drives that is not associated with said access from said host device;

monitoring means for monitoring an amount of access determined using either or both of an amount of data transfer or a frequency of access by said host device; and means for adjusting an operating ratio of said background process to said access from said host in accordance with said amount of access to provide time for conducting said background process.

2. An apparatus as set forth in claim 1, wherein said disk array control unit has:

means for counting an amount of data transfer to or from said host device as said amount of access;

means for temporarily restraining an access requirement from the host device when there is background processing requirement and the amount of data transfer reaches a predetermined transfer amount; and means for executing the background process.

3. An apparatus as set forth in claim 2, wherein said disk array control unit includes an idle counter, and wherein said disk array control unit increments said idle counter upon each run of a processing program, to accept said background processing requirement when said idle counter reaches a predetermined count value, temporarily restrains the access requirement from said host device when the amount of data transfer reaches the predetermined transfer amount, and executes the background process upon acceptance of said background processing requirement.

4. An apparatus as set forth in claim 3, wherein said disk array control unit executes the background process upon determining that no access is made from said host device.

5. An apparatus as set forth in claim 3, wherein said disk array control unit clears the amount of data transfer counted by said means for counting upon completion of said background process.

6. An apparatus as set forth in claim 1, wherein said disk array control unit includes:

a host controller for controlling interfacing of the disk array control unit with the host device;

device interface and device controllers for controlling said storage disk drives in parallel;

a data transfer controller for transferring data between said host controller and said device interface and device controllers; and a main controller including said monitoring means for controlling the host, data transfer, device and device interface controllers, said main controller monitoring through said monitoring means said amount of access from said host device and accepting a background processing requirement from said device and device interface controllers, counting an amount of data transfer to or from said host device as the amount of access, temporarily restraining an access requirement from said host device when the amount of data transfer reaches a predetermined transfer amount, and permitting said device and device interface controllers to execute the background process upon acceptance of the background processing requirement.

7. An apparatus as set forth in claim 6, wherein said main controller includes an idle counter for counting the number of times a processing program is executed and a transfer block counter for counting the amount of data transfer to or from the host device, and wherein said main controller accepts said background processing requirement when said idle counter reaches a predetermined count value, temporarily restrains said access requirement from said host device when the amount of data transfer amount reaches the predetermined transfer amount, and executes the background process upon acceptance of the background processing requirement.

8. An apparatus as set forth in claim 7, wherein said main controller executes the background processing upon determining that no access is made from said host device.

9. An apparatus as set forth in any one of claims 1 to 8, wherein said storage disk drives include a plurality of working storage disk drives and a spare storage disk drive, and wherein said background process is a data reconstruction process which is executed, when one of the working storage disk drives fails, for reconstructing data that was stored on the failed storage disk drive from data stored in other working storage disk drives and writing the reconstructed data on the spare storage disk drive.

10. An apparatus as set forth in any one of claims 1 to 8, wherein said background process is a replacement process for replacing a failed part of said storage disk drives.

11. An apparatus as set forth in any one of claims 1 to 8, wherein said background process is a medium initialization process for said storage disk drives.

12. An apparatus as set forth in claim 1, wherein said disk array has:

means for counting an access frequency of said host device as the amount of access;

means for restraining an access requirement from said host device temporarily depending upon whether or not there is any background processing requirement when the access frequency of said host device reaches a predetermined frequency amount; and means for executing the background process.

13. An apparatus as set forth in claim 12, wherein said disk array control unit includes an idle counter, and wherein said disk array control unit increments the idle counter upon each run of a processing program, accepts the background processing requirement when the idle counter reaches a predetermined count value, temporarily restrains the access requirement from said host device when the access frequency of said host device reaches the predetermined frequency amount, and executes the background process upon acceptance of the background processing requirement.

14. An apparatus as set forth in claim 1, wherein said disk array control unit includes:
- a host controller for controlling interfacing of the disk array control unit with the host device;
- device interface and device controllers for controlling said storage disk drives in parallel;
- a data transfer controller for transferring data between said host controller and said device interface and device controllers; and
- a main controller including said monitoring means for controlling the host, data transfer, device and device interface controllers, said main controller monitoring through said monitoring means said amount of access from said host device and accepting a background processing requirement from said device and device interface controllers, counting an access frequency of said host device as the amount of access, temporarily restraining an access requirement from said host device when the access frequency reaches a predetermined frequency amount, and permitting said guest controller to execute the background process upon acceptance of a background processing requirement.

15. An apparatus as set forth in claim 14, wherein said main controller includes an idle counter for counting the number of times a processing program is executed and an access counter for counting the access frequency of said host device, and wherein said main controller accepts said background processing requirement when the content of said idle counter reaches a predetermined count value, temporarily restrains said access requirement from said host device when the access frequency reaches a predetermined frequency amount, and executes the background processing upon acceptance of the background processing requirement.

16. An apparatus as set forth in claim 1, wherein said disk array control unit includes:
- a host controller for controlling interfacing of the disk array control unit with the host device;
- device interface and device controllers for controlling the storage disk drives in parallel;
- a data transfer controller for transferring data between said host controller and said device interface and device controllers; and
- a main controller including said monitoring means for controlling the host, data transfer, device and device interface controllers, said main controller monitoring through said monitoring means the amount of access from said host device and accepting a background processing requirement from the device interface and device controllers, counting an amount of data transfer to or from said host device as the amount of access, temporarily restraining the access requirement from said host device when the data transfer amount reaches a predetermined transfer amount, or by counting an access frequency of said host device as the amount of access temporarily restraining an access requirement from said host device when the access frequency reaches the predetermined frequency amount, and permitting the device interface and device controllers to execute the background process upon acceptance of the background processing requirement.

17. An apparatus as set forth in claim 16, wherein said main controller includes an idle counter for counting the number of times a processing program is executed, a transfer counter for counting the amount of data translink to or from said host device and an access counter for counting the access frequency of said host device, and wherein said main controller accepts said background processing requirement when the content of the idle counter reaches a predetermined count value, temporarily restrains an access requirement from said host device, when the data transfer reaches a predetermined transfer amount or when the access frequency reaches a predetermined frequency amount, and executes the background processing upon acceptance of the background processing requirement.

18. An apparatus as set forth in any of claims 12 to 17, wherein said storage disk drives include a plurality of working storage disk drives and a spare storage disk drive, and wherein said background process is a data reconstruction process which is executed, when one of the working storage disk drives fails, for reconstructing data that was stored in the failed storage disk drive from data stored in other working storage disk drives and writing the reconstructed data in the spare storage disk device.

19. An apparatus as set forth in any of claims 12 to 17, wherein said background process is a replacement process for replacing a failed part of said storage disk drives.

20. An apparatus as set forth in any of claims 12 to 17, wherein said background process is a medium initialization process for said storage disk drives.

21. An apparatus as set forth in claim 1, wherein said plurality of storage disk drives includes a spare storage disk drive and working disk drives and said background process is a data reconstruction process, wherein said disk array control unit has means for monitoring an access frequency of said host device as the amount of access, and wherein one of said working disk drives fails, for reconstructing data that was stored in the failed working storage disk drive from data stored in other working storage disk drives, making use of spare time during which there is no access from said host device, for storing the reconstructed data in the spare storage disk drive, and for changing a data reconstruction amount according to the access frequency until the spare time becomes available.

22. An apparatus as set forth in claim 21, wherein said disk array control unit sets a data reconstruction amount to a small amount when the access frequency of said host device is high, and sets the data reconstruction amount to a large amount when the access frequency is low.

23. An apparatus as set forth in claim 22, wherein said disk array control unit sets a data reconstruction amount to a large amount when a high access frequency state has been continued for more than a predetermined access period, even if the access frequency of said host device is high.

24. An apparatus as set forth in claims 21, 22, or 23, wherein the disk array control unit discriminates the presence or absence of an access requirement from said host device, determines that spare time is available when the absence of the access requirement has been discriminated more than a specified number of times, and determines the access frequency based on a period which has elapsed since the absence of the access requirement has been discriminated more than the specified number of times.

25. An apparatus as set forth in claim 1, wherein said plurality of storage disk drive includes a spare storage disk drive and a plurality of working disk drives and said background process is a data reconstruction process, wherein said disk array control unit has means for monitoring an access frequency of said host device, and wherein said disk array control unit, when one of working storage disk drives fails, reconstructs data that was stored in the failed working storage disk drive from data stored in other working storage drives, making use of a spare time during which there is no access from said host device, stores the reconstructed data in the spare storage disk drive, and changes a data reconstruction amount according to the access frequency until the spare time becomes available, and wherein said disk array control unit includes:

a host controller for controlling interfacing of the disk array control unit with said host device;

device interface and device for controlling the storage disk drives in parallel;

a data transfer controller for transferring data between said host controller and said device interface and device controllers; and a main controller including said means for monitoring through said monitoring means for controlling the host, data transfer, device and device interface, said main controller monitoring an access frequency of said host device as the amount of access, designating to said device interface and device controllers a data reconstruction amount according to the access frequency until the spare time becomes available, and said device interface and device controllers carrying out the data reconstruction process using the data reconstruction amount designated by the main controller.

26. An apparatus as set forth in claim 25, wherein said main controller includes an idle counter for counting the occurrences of absence of access of said host device, and wherein said main controller discriminates the presence or absence of an access requirement from said host device, determines that the spare time is available when a value of said idle counter exceeds a predetermined count value, and determines the access frequency based on a period which has elapsed before the value of said idle counter exceeds the predetermined count value.

27. An apparatus as set forth in claim 26, wherein said main controller sets a data reconstruction amount to a small amount when a long period has elapsed until the value of said idle counter exceeds the predetermined count value, and sets the data reconstruction amount at a large amount when a short period has elapsed before the value of said idle counter exceeds the predetermined count value.

28. An apparatus as set forth in claim 26, wherein said main controller includes a high access counter for counting the number of times when the access frequency of said host device is high, and wherein said main controller sets the data reconstruction amount to a large amount when a value of the high access counter exceeds a predetermined high count value.

29. A method for controlling a background process in a disk array device including a plurality of storage disk drives, wherein a disk array control unit accesses said plurality of storage disk drives in parallel when a command for an access is issued from a host device, and executes a background process for said plurality of storage disk drives, that is not associated with said access from said host device, and wherein said method includes:

a step of monitoring an amount of said access determined using either or both of an amount of data transfer or a frequency of access from said host device;

a step of adjusting an operating ratio of said background process to said access from said host in accordance with said amount of access to provide time for conducting said background process.

30. A method as set forth in claim 29, wherein said method includes:

a step of counting an amount of data transfer to or from said host device as the amount of access;

a step of temporarily restraining an access requirement from the host device depending upon whether or not there is any background processing requirement when the data transfer amount reaches a predetermined transfer amount; and a step of executing the background process.

31. A method as set forth in claim 29, wherein said method includes:

a step of counting an access frequency of said host device as the amount of access;

a step of temporarily restraining an access requirement from said host device depending upon whether or not there is any background processing requirement when the access frequency reaches a predetermined frequency amount; and a step of executing the background process.

32. A method as set forth in claim 29, wherein said plurality of storage disk drives includes a spare storage disk drive and a plurality of working disk drives and said background process is a data reconstruction process, wherein said disk array control unit, when one of working storage disk drives fails, reconstructs data that was stored in the failed working storage disk drive from data stored in other working storage disk drives, making use of spare time during which there is no access from said host device, and stores the reconstructed data in the spare storage disk drive, and wherein said method includes:

a step of monitoring an access frequency of said host device as the amount of access; and a step of changing a data reconstruction amount according to the access frequency until the spare time becomes available.

* * * * *

UNITED STATES PATENT AND TRADEMARK OFFICE
CERTIFICATE OF CORRECTION

PATENT NO. : 5,537,566
DATED : July 16, 1996
INVENTOR(S) : Konno et al.

It is certified that error appears in the above-indentified patent and that said Letters Patent is hereby corrected as shown below:

Column 2, line 28, after "process. A", insert --typical--.

Column 4, line 4, after "unit", insert --. Spare time is--; delete "spare time,".

Column 5, line 37, delete "is".

Column 6, line 43, delete "is".

Column 7, line 53, after "39", insert --)--.

Column 7, line 55, delete "access" and insert --accesses--.

UNITED STATES PATENT AND TRADEMARK OFFICE
CERTIFICATE OF CORRECTION

PATENT NO. : 5,537,566
DATED : July 16, 1996
INVENTOR(S) : Konno et al.

It is certified that error appears in the above-indentified patent and that said Letters Patent is hereby corrected as shown below:

Column 9, line 34, delete "outerface/" and insert --interface/--.

Column 10, line 33, delete "and".

Column 18, line 15, delete "outerface/device" and insert --interface/device--.

Column 28, line 6, delete "translink" and insert --transfer--.

Signed and Sealed this

Sixteenth Day of September, 1997

Attest:

BRUCE LEHMAN

Attesting Officer

Commissioner of Patents and Trademarks